US012809257B2

(12) United States Patent
Koh et al.

(10) Patent No.: US 12,809,257 B2
(45) Date of Patent: Nov. 24, 2026

(54) RESIST COMPOSITION AND METHOD OF FORMING PATTERN BY USING THE SAME

(71) Applicant: Samsung Electronics Co., Ltd., Suwon-si (KR)

(72) Inventors: Haengdeog Koh, Suwon-si (KR); Cheol Kang, Suwon-si (KR); Yoonhyun Kwak, Suwon-si (KR); Minsang Kim, Suwon-si (KR); Sunyoung Lee, Suwon-si (KR); Changheon Lee, Suwon-si (KR); Kyuhyun Im, Suwon-si (KR); Jungha Chae, Suwon-si (KR); Sunghyun Han, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 759 days.

(21) Appl. No.: 18/326,617

(22) Filed: May 31, 2023

(65) Prior Publication Data

US 2024/0231228 A1 Jul. 11, 2024

(30) Foreign Application Priority Data

Dec. 27, 2022 (KR) ........................ 10-2022-0186383

(51) Int. Cl.

*G03F 7/038* (2006.01)
*C08F 12/30* (2006.01)
*G03F 7/004* (2006.01)

(52) U.S. Cl.

CPC ............ *G03F 7/0382* (2013.01); *C08F 12/30* (2013.01); *G03F 7/0045* (2013.01)

(58) Field of Classification Search

CPC ..... G03F 7/0042; G03F 7/0045; C08F 220/06
See application file for complete search history.

(56) References Cited

U.S. PATENT DOCUMENTS

2005/0260518 A1* 11/2005 Mori ........................ G03C 1/54 430/190
2012/0208127 A1* 8/2012 Hatakeyama ......... G03F 7/0043 430/296

(Continued)

FOREIGN PATENT DOCUMENTS

JP 62192412 A * 8/1987
JP 1987-257904 A 11/1987

(Continued)

OTHER PUBLICATIONS

Machine translation of JP 62-192412 (no date) (Year: 0000).*

(Continued)

*Primary Examiner* — Amanda C. Walke
(74) *Attorney, Agent, or Firm* — Harness, Dickey & Pierce, P.L.C.

(57) ABSTRACT

Provided are a resist composition and a method of forming a pattern using the same, the resist composition including an organometallic compound represented by Formula 1 below, and a polymer including a repeating unit represented by Formula 2 below:

Formula 1

$$M_{11}(R_{11})_n(OR_{12})_{(4-n)},$$

(Continued)

-continued

Formula 2

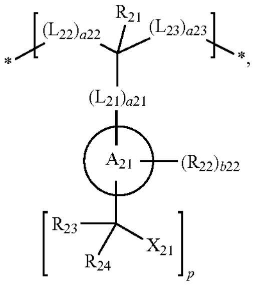

wherein, in Formulas 1 and 2, $M_{11}$, $R^{11}$, $R_{12}$, n, $A_{21}$, $L_{21}$ to $L_{23}$, a21 to a23, $R_{21}$ to $R_{24}$, b22, p, and $X_{21}$ are as described in the specification.

20 Claims, 20 Drawing Sheets

(56) References Cited

U.S. PATENT DOCUMENTS

| | | | | |
|---|---|---|---|---|
| 2019/0310552 | A1 | 10/2019 | Asano et al. | |
| 2020/0041896 | A1* | 2/2020 | Moon | G03F 7/0042 |
| 2020/0257195 | A1* | 8/2020 | Kudo | G03F 7/0043 |
| 2021/0311387 | A1 | 10/2021 | Woo et al. | |
| 2021/0333708 | A1 | 10/2021 | Moon et al. | |
| 2022/0197138 | A1 | 6/2022 | Moon et al. | |
| 2024/0124635 | A1* | 4/2024 | Kim | C08F 228/06 |
| 2024/0231223 | A1 | 7/2024 | Koh et al. | |
| 2024/0231225 | A1* | 7/2024 | Koh | G03F 7/0042 |

FOREIGN PATENT DOCUMENTS

| | | | | | |
|---|---|---|---|---|---|
| JP | 01009207 | A | * | 1/1989 | |
| JP | 2020021071 | A | * | 2/2020 | G03F 7/0035 |
| KR | 10-2020-0014185 | A | | 2/2020 | |
| KR | 2022-0088013 | A | | 6/2022 | |

OTHER PUBLICATIONS

Machine translation of JP 01-009207 (no date) (Year: 0000).*

Machine translation of JP 2020-021071 (no date) (Year: 0000).*

Extended European Search Report for corresponding European Patent Application No. 23178646.8 issued on Dec. 8, 2023.

Mixon D.A. et al.: "Synthesis and Characterization of an Organogermanium Resist: Poly(trimethylgermylmethyl methacrylate-co-chloromethylstyrene)," Journal of Vacuum Science and Technology: Part B, AVS/AIP, Melville, New York, NY, US, vol. 7, No. 6, (Nov. 1, 1989), pp. 1723-1728, XP000249736.

Suzuki M. et al.: "Copolymers of Trimethylsilylstyrene with Chloromethylstyrene for a Bi-Layer Resist System." Journal of the Electrochemical Society, vol. 130, No. 9, (Sep. 1, 1983), pp. 1962-1964, XP001394821.

Low-line edge roughness extreme ultraviolet photoresists of organotin carboxylates, Japanese Journal of Applied Physics 58, 016504 (2019).

Low-line edge roughness extreme ultraviolet photoresists of organotin carboxylates, J. Micro/Nanolith. MEMS MOEMS 14(4), 043506 (Oct.-Dec. 2015).

* cited by examiner

COMPARATIVE EXAMPLE 2

RESIST COMPOSITION AND METHOD OF FORMING PATTERN BY USING THE SAME

CROSS-REFERENCE TO RELATED APPLICATION

This application is based on and claims priority under 35 U.S.C. § 119 to Korean Patent Application No. 10-2022-0186383, filed on Dec. 27, 2022, in the Korean Intellectual Property Office, the disclosure of which is incorporated by reference herein in its entirety.

BACKGROUND

1. Field

The inventive concepts relate to resist compositions and methods of forming a pattern by using the same.

2. Description of the Related Art

In semiconductor manufacturing, resists of which physical properties change in response to light are used to form fine patterns. Among the resists, chemically amplified resists have been widely used. In the chemically amplified resists, an acid formed by reacting light with a photoacid generator reacts again with a base resin to change solubility of the base resin in a developing solution, and thereby enabling patterning.

However, for the chemically amplified resists, issues such as reduced uniformity of a pattern or increased surface roughness may occur as the formed acid diffuses to an unexposed area. In addition, as semiconductor processes are performed in an increasingly minute scale, it is not easy to control acid diffusion, and thus, the development of a resist using a new method is required.

Recently, attempts have been made to develop materials of which physical properties change by exposure to light, in order to overcome limitations of the chemically amplified resists. However, there is still an issue that a high dose of exposure is required.

SUMMARY

Some example embodiments provide a resist composition and a method of forming a pattern by using the resist composition, wherein the resist composition changes physical properties even when exposed at a low dose and provides a pattern with improved resolution.

Additional aspects will be set forth in part in the description which follows and, in part, will be apparent from the description, or may be learned by practice of the presented example embodiments of the inventive concepts.

According to some example embodiments, a resist composition includes an organometallic compound represented by Formula 1 below and a polymer including a repeating unit represented by Formula 2 below:

Formula 1

$$M_{11}(R_{11})_n(OR_{12})_{(4\text{-}n)},$$

-continued

Formula 2

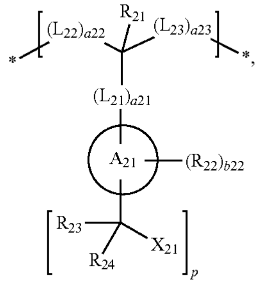

wherein, in Formulas 1 and 2, $M_{11}$ may be indium (In), tin (Sn), antimony (Sb), tellurium (Te), thallium (Tl), lead (Pb), bismuth (Bi), silver (Ag), or polonium (Po), $R_{11}$ may be a linear, branched, or cyclic $C_1$-$C_{30}$ monovalent hydrocarbon group optionally containing one or more heteroatoms, $R_{12}$ may be a linear, branched, or cyclic $C_1$-$C_{30}$ monovalent hydrocarbon group optionally containing one or more heteroatoms, or may be *-$M_{12}(R_{13})_m(OR_{14})_{(3\text{-}m)}$, n may be an integer of 1 to 4, $M_{12}$ may be indium (In), tin (Sn), antimony (Sb), tellurium (Te), thallium (Tl), lead (Pb), bismuth (Bi), silver (Ag), or polonium (Po), $R_{13}$ and $R_{14}$ may each independently be a linear, branched, or cyclic $C_1$-$C_{30}$ monovalent hydrocarbon group optionally containing one or more heteroatoms, m may be an integer of 0 to 3, $L_{21}$ to $L_{23}$ may each independently be a single bond, O, S, C(═O), C(═O)O, OC(═O), C(═O)NH, NHC(═O), a linear, branched, or cyclic $C_1$-$C_{30}$ divalent hydrocarbon group optionally containing one or more heteroatoms, or any combination thereof, a21 to a23 may each independently be an integer of 1 to 4, $A_{21}$ may be a $C_1$-$C_{30}$ aryl group or a $C_1$-$C_{30}$ heteroaryl group, $R_{21}$ to $R_{24}$ may each independently be hydrogen, deuterium, a halogen, or a linear, branched, or cyclic $C_1$-$C_{30}$ monovalent hydrocarbon group optionally containing one or more heteroatoms, b22 may be an integer of 1 to 10, p may be an integer of 1 to 10, $X_{21}$ may be a leaving group, and * is a binding site with a neighboring atom.

A bond between $M_{11}$ and $R_{11}$ may be an $M_{11}$-carbon single bond, and a bond between $M_{12}$ and $R_{13}$ may be an $M_{12}$-carbon single bond.

The organometallic compound may have a molecular weight of about 3,000 g/mol or less.

$M_{11}$ and $M_{12}$ may each independently be Sn, Sb, Te, Bi, or Ag.

In Formula 1, $R_{11}$ and $R_{13}$ may each independently be represented by *-$(L_{11})_{a11}$-$X_{11}$, $R_{12}$ and $R_{14}$ may each independently be represented by *-$(L_{12})_{a12}$-$X_{12}$, $L_{11}$ and $L_{12}$ may each independently be $CR_aR_b$, C═O, S═O, $SO_2$, $PO_2$, or $PO_3$, a11 and a12 may each independently be an integer of 0 to 3, $X_{11}$ and $X_{12}$ may each independently be, a substituted or unsubstituted $C_1$-$C_{30}$ alkyl group, a substituted or unsubstituted $C_1$-$C_{30}$ halogenated alkyl group, a substituted or unsubstituted $C_1$-$C_{30}$ alkoxy group, a substituted or unsubstituted $C_1$-$C_{30}$ alkylthio group, a substituted or unsubstituted $C_1$-$C_{30}$ halogenated alkoxy group, a substituted or unsubstituted $C_1$-$C_{30}$ halogenated alkylthio group, a substituted or unsubstituted $C_3$-$C_{30}$ cycloalkyl group, a substituted or unsubstituted $C_3$-$C_{30}$ cycloalkoxy group, a substituted or unsubstituted $C_3$-$C_{30}$ cycloalkylthio group, a substituted or unsubstituted $C_3$-$C_{30}$ heterocycloalkyl group, a substituted or an unsubstituted $C_3$-$C_{30}$ heterocycloalkoxy group, a substituted or unsubstituted $C_3$-$C_{30}$ heterocycloalkylthio group, a substituted or unsubstituted $C_2$-$C_{30}$ alkynyl group, a substituted or unsubstituted $C_2$-$C_{30}$ alkynyloxy group, a substituted or unsubstituted $C_2$-$C_{30}$ alkynylthio group, a substituted or unsubstituted $C_6$-$C_{30}$ aryl group, a substituted or unsubstituted substituted or unsubstituted $C_6$-$C_{30}$ aryloxy group, a substituted or unsubstituted $C_6$-$C_{30}$ arylthio group, a substituted or unsubstituted $C_1$-$C_{30}$ heteroaryl group, a substituted or unsubstituted $C_1$-$C_{30}$ heteroaryloxy group, or a substituted or unsubstituted $C_1$-$C_{30}$ heteroarylthio group, $R_a$ and $R_b$ may each independently be hydrogen, deuterium, a hydroxyl group, a cyano group, a nitro group, a substituted or unsubstituted $C_1$-$C_{30}$ alkyl group, a substituted or unsubstituted $C_1$-$C_{30}$ alkoxy group, a substituted or unsubstituted $C_1$-$C_{30}$ alkylthio group, a substituted or unsubstituted $C_3$-$C_{30}$ cycloalkyl group, a substituted or unsubstituted $C_3$-$C_{30}$ cycloalkoxy group, or a substituted or unsubstituted $C_3$-$C_{30}$ cycloalkylthio group, and * is a binding site with a neighboring atom.

The organometallic compound may be represented by any one of Formulas 1-1 to 1-16:

1-1

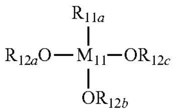

1-2

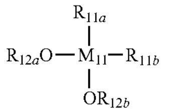

1-3

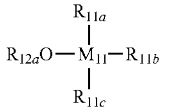

1-4

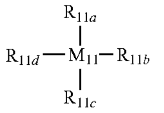

1-5

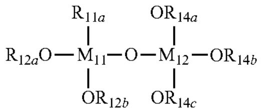

1-6

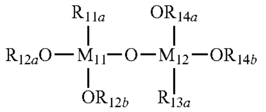

1-7

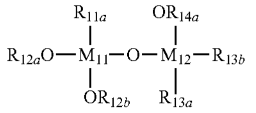

1-8

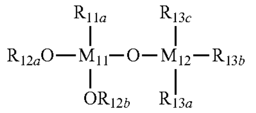

1-9

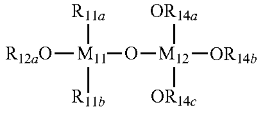

-continued 1-10

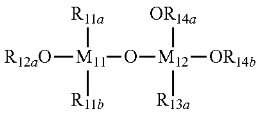

1-11

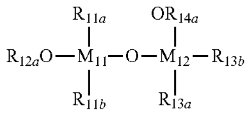

1-12

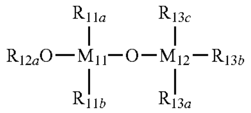

1-13

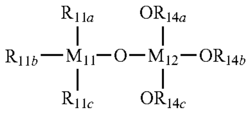

1-14

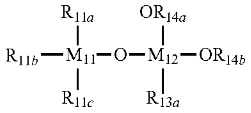

1-15

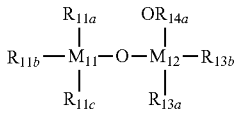

1-16

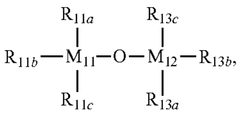

wherein, in Formulas 1-1 to 1-16, $M_{11}$ and $M_{12}$ may each independently be indium (In), tin (Sn), antimony (Sb), tellurium (Te), thallium (Tl), lead (Pb), bismuth (Bi), silver (Ag), or polonium (Po), $R_{11a}$ to $R_{11d}$ may each independently be a linear, branched, or cyclic $C_1$-$C_{30}$ monovalent hydrocarbon group optionally containing one or more heteroatoms, $R_{12a}$ to $R_{12c}$ may each independently be a linear, branched, or cyclic $C_1$-$C_{30}$ monovalent hydrocarbon group optionally containing one or more heteroatoms or is $*\text{-}M_{12}(R_{13})_m(OR_{14})_{(3-m)}$, wherein $M_{12}$ is indium (In), tin (Sn), antimony (Sb), tellurium (Te), thallium (Tl), lead (Pb), bismuth (Bi), silver (Ag), or polonium (Po), $R_{13}$ and $R_{14}$ are each independently a linear, branched, or cyclic $C_1$-$C_{30}$ monovalent hydrocarbon group optionally containing one or more heteroatoms, m is an integer of 0 to 3, and * is a binding site with a neighboring atom, $R_{13a}$ to $R_{13c}$ may each independently be a linear, branched, or cyclic $C_1$-$C_{30}$ monovalent hydrocarbon group optionally containing one or more heteroatoms, and $R_{14a}$ to $R_{14c}$ may each independently be a linear, branched, or cyclic $C_1$-$C_{30}$ monovalent hydrocarbon group optionally containing one or more heteroatoms.

The polymer may not include any repeating unit that includes any acid labile group.

In Formula 2, $A_{21}$ may be a benzene group, a naphthalene group, a phenanthrene group, an anthracene group, a chrysene group, a pyrene group, a triphenylene group, a fluorene group, a pyrrole group, a furan group, a thiophene group, an imidazole group, an oxazole group, a thiazole group, a pyridine group, a pyrazine group, a triazine group, a quinoline group, an isoquinoline group, a benzoquinoline group, a quinoxaline group, a quinazoline group, a cinoline group, a phenanthroline group, a phenanthridine group, an indole group, a benzofuran group, a benzothiophene group, a benzimidazole group, a benzoxazole group, a benzothiazole group, a carbazole group, a dibenzofuran group, or a dibenzothiophene group.

In Formula 2, $X_{21}$ may be an ammonium salt, a phosphonium salt, a sulfonium salt, a selenonium salt, an iodonium salt, a halogen, $R_{31}SO_3$, $R_{31}CO_2$, $R_{31}PO_2(OR_{32})$, or $NO_3$, and $R_{31}$ and $R_{32}$ may each independently be a linear, branched, or cyclic $C_1$-$C_{30}$ monovalent hydrocarbon group optionally containing one or more heteroatoms.

In Formula 2, $X_{21}$ may be a group represented by Formulas 3-1 to 3-3, Cl, Br, I, $R_{31}SO_3$, $R_{31}CO_2$, $R_{31}PO_2(OR_{32})$, or $NO_3$, where $R_{31}$ and $R_{32}$ may each independently be a linear, branched, or cyclic $C_1$-$C_{30}$ monovalent hydrocarbon group optionally containing one or more heteroatoms:

3-1

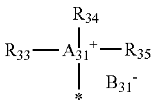

3-2

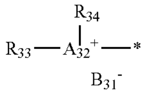

3-3

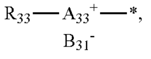

wherein, in Formulas 3-1 to 3-3, $A_{31}$ may be N or P, $A_{32}$ may be S or Se, $A_{33}$ may be I, and $B_{31}^-$ may be a counter anion, $R_{33}$ to $R_{35}$ may each independently be a linear, branched, or cyclic $C_1$-$C_{30}$ monovalent hydrocarbon group optionally containing one or more heteroatoms, two adjacent groups of $R_{33}$ to $R_{35}$ may optionally bond to each other to form a ring (e.g., any two adjacent groups of $R_{33}$ to $R_{35}$ may be independently present or are bonded to each other to form a ring, and * is a binding site with a neighboring atom of Formula 2.

In some example embodiments, the polymer may be a copolymer including: a first repeating unit represented by Formula 2-1 below; and a second repeating unit represented by Formula 2-2 below:

Formula 2-1

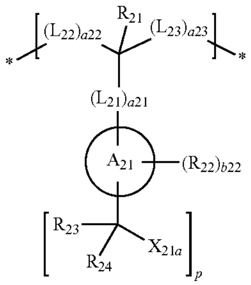

-continued

Formula 2-2

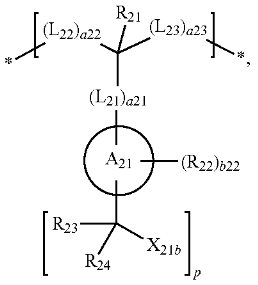

wherein, in Formulas 2-1 and 2-2, $L_{21}$ to $L_{23}$ may each independently be a single bond, O, S, C(=O), C(=O)O, OC(=O), C(=O)NH, NHC(=O), or a linear, branched, or cyclic $C_1$-$C_{30}$ divalent hydrocarbon group optionally containing one or more heteroatoms, or any combination thereof, a21 to a23 may each independently be an integer of 1 to 4, $R_{21}$ to $R_{24}$ may each independently be hydrogen, deuterium, a halogen, or a linear, branched, or cyclic $C_1$-$C_{30}$ monovalent hydrocarbon group optionally containing one or more heteroatoms, b22 may be an integer of 1 to 10, p may be an integer of 1 to 10, $X_{21a}$ may be an ammonium salt, a phosphonium salt, a sulfonium salt, a selenium salt, or an iodonium salt, $X_{21b}$ may be a halogen, $R_{31}SO_3$, $R_{31}CO_2$, $R_{31}PO_2(OR_{32})$, or $NO_3$, $R_{31}$ and $R_{32}$ may each independently be a linear, branched, or cyclic $C_1$-$C_{30}$ monovalent hydrocarbon group optionally containing one or more heteroatoms, and * is a binding site with a neighboring atom of a neighboring repeating unit of the polymer.

In some example embodiments, the polymer may include a first repeating unit represented by Formula 2-1, and not include any second repeating unit represented by Formula 2-2.

In some example embodiments, the polymer may not include any first repeating unit represented by Formula 2-1, and include a second repeating unit represented by Formula 2-2.

According to some example embodiments of the inventive concepts, a resist composition includes an organometallic compound represented by Formula 1 below and a monomer represented by Formula 20 below:

Formula 1

$$M_{11}(R_{11})_n(OR_{12})_{(4-n)},$$

Formula 2

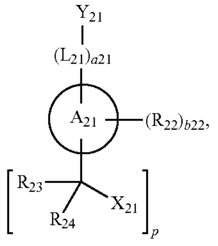

wherein, in Formulas 1 and 2, $M_{11}$ may be indium (In), tin (Sn), antimony (Sb), tellurium (Te), thallium (Tl), lead (Pb), bismuth (Bi), silver (Ag), or polonium (Po), $R_{11}$ may be a linear, branched, or cyclic $C_1$-$C_{30}$ monovalent hydrocarbon group optionally containing one or more heteroatoms, $R_{12}$ may be a linear, branched, or cyclic $C_1$-$C_{30}$ monovalent hydrocarbon group optionally containing one or more heteroatoms, or may be $*-M_{12}(R_{13})_m(OR_{14})_{(3-m)}$, n may be an integer of 1 to 4, $M_{12}$ may be indium (In), tin (Sn), antimony (Sb), tellurium (Te), thallium (Tl), lead (Pb), bismuth (Bi), silver (Ag), or polonium (Po), $R_{13}$ and $R_{14}$ may each independently be a linear, branched, or cyclic $C_1$-$C_{30}$ monovalent hydrocarbon group optionally containing one or more heteroatoms, m may be an integer of 0 to 3, $Y_{21}$ may be a polymerizable group, $L_{21}$ may be a single bond, O, S, C═O, C(═O)O, OC(═O), C(═O)NH, NHC(═O), a linear, branched, or cyclic $C_1$-$C_{30}$ divalent hydrocarbon group optionally containing one or more heteroatoms, or any combination thereof, a21 may be an integer of 1 to 4, $A_{21}$ may be a $C_1$-$C_{30}$ aryl group or a $C_1$-$C_{30}$ heteroaryl group, $R_{21}$ to $R_{24}$ may each independently be hydrogen, deuterium, a halogen, or a linear, branched, or cyclic $C_1$-$C_{30}$ monovalent hydrocarbon group optionally containing one or more heteroatoms, b22 may be an integer of 1 to 10, p may be an integer of 1 to 10, $X_{21}$ may be a leaving group, and * is a binding site with a neighboring atom (e.g., a neighboring atom of a neighboring repeating unit of the polymer).

In Formula 2, $Y_{21}$ may include a vinyl group, an acrylate group, a methacrylate group, an oxirane group, an epoxy group, an oxetane group, a thiol group, or any combination thereof, as a partial structure.

According to some example embodiments of the inventive concepts, a method of forming a pattern includes forming a resist film by applying the above-described resist composition, exposing at least a portion of the resist film with high-energy rays to establish an exposed resist film, and developing the exposed resist film by using a developing solution.

The exposing may be performed based on irradiating deep ultraviolet (DUV) rays, extreme ultraviolet (EUV) rays, and/or electron beams (EBs).

Chemical bonds may be formed between the organometallic compound and the polymer based on exposing at least the portion of the resist film with the high-energy rays.

Based on the exposing at least the portion of the resist film, the resist film may include an exposed portion and an unexposed portion, and the developing the exposed resist film includes removing, the unexposed portion.

BRIEF DESCRIPTION OF THE DRAWINGS

The above and other aspects, features, and advantages of certain embodiments of the inventive concepts will be more apparent from the following description taken in conjunction with the accompanying drawings, in which.

DETAILED DESCRIPTION

Figure 1:
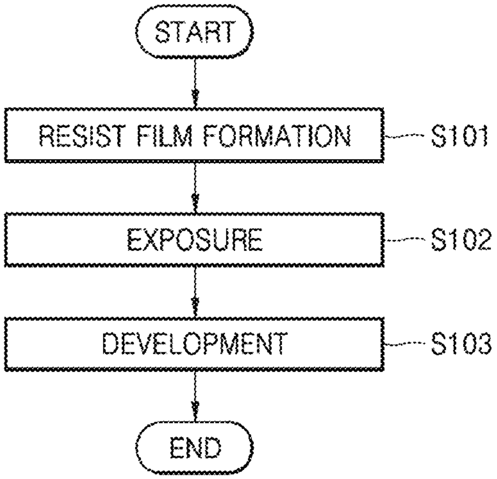
FIG. 1 is a flowchart illustrating a method according to some example embodiments.

Reference will now be made in detail to example embodiments, some of which are illustrated in the accompanying drawings, wherein like reference numerals refer to like elements throughout. In this regard, some example embodiments may have different forms and should not be construed as being limited to the descriptions set forth herein. Accordingly, some example embodiments are merely described below, by referring to the figures, to explain aspects. As used herein, the term "and/or" includes any and all combinations of at least one of the associated listed items. Expressions such as "at least one of," when preceding a list of elements, modify the entire list of elements and do not modify the individual elements of the list.

The inventive concepts may be modified in various forms and have many embodiments, and particular embodiments are illustrated in the drawings and are described in the detailed description. However, this does not intend to limit the inventive concepts within particular embodiments, and it should be understood that the inventive concepts covers all the modifications, equivalents, and replacements within the idea and technical scope of the inventive concepts. In describing the inventive concepts, detailed descriptions of related known art will be omitted when it is determined that the detailed descriptions may obscure the gist of the inventive concepts.

Hereinafter, the terms "above" or "on" may include not only those that are directly on in a contact manner, but also those that are above in a non-contact manner. The singular forms "a," "an," and "the" as used herein are intended to include the plural forms as well unless the context clearly indicates otherwise. It will be understood that the terms "comprise," "include," or "have" as used herein specify the presence of stated elements, but do not preclude the presence or addition of one or more other elements.

The use of the term "the" and similar demonstratives may correspond to both the singular and the plural. Operations constituting methods may be performed in any suitable order unless otherwise indicated herein or otherwise clearly contradicted by context, and are not necessarily limited to the stated order.

The use of all illustrations or illustrative terms in some example embodiments is simply to describe the technical ideas in detail, and the scope of the present inventive concepts is not limited by the illustrations or illustrative terms unless they are limited by claims.

Regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed, or an effect such as a structure is described to be established "by" or "through" performing additional operations, it will be understood that the operation may be performed and/or the effect/structure may be established "based on" the additional operations, which may include performing said additional operations alone or in combination with other further additional operations.

It will be understood that, although the terms "first", "second", "third", etc., may be used herein to describe various elements, these terms are only used to distinguish one element from another element, and the order, type, etc. of the elements are not limited.

As used herein, when an element such as a layer, a film, a region, or a substrate is referred to as being "on" or "above" another element, it may be right above, below, left, or right in contact as well as being above, below, left, or right without contact.

As used herein, the singular of any term includes the plural, unless the context otherwise requires. As used herein, the expression of "include" or "have" indicates a presence of a characteristic, a number, a phase, a movement, an element, a component, or combinations of components described in the specification, and it should not be construed to exclude in advance an existence or possibility of existence of at least one of other characteristics, numbers, movements, elements, components, or combinations of components.

Wherever a range of values is given, that range includes every value falling within the range, as if written out explicitly, and further includes the values bounding the range. Thus, a range of "X to Y" includes every value falling between X and Y, and also includes X and Y.

As used herein, "$C_x$-$C_y$" refers that a number (e.g., quantity) of carbons constituting a substituent is x to y, wherein x and y may each be any natural number. For example, "$C_1$-$C_6$" refers that a number of carbons constituting the substituent is 1 to 6, and "$C_6$-$C_{20}$" refers that a number of carbons constituting the substituent is 6 to 20.

The term "monovalent hydrocarbon group" as used herein may refer to a monovalent moiety derived from an organic compound including carbon and hydrogen, or a derivative thereof, and the monovalent hydrocarbon group may include, for example, a linear or branched alkyl group (for example, a methyl group, an ethyl group, a propyl group, an isopropyl group, a butyl group, an isobutyl group, a sec-butyl group, a tert-butyl group, a pentyl group, a neopentyl group, a hexyl group, a heptyl group, a 2-ethylhexyl group, and a nonyl group); a monovalent saturated cycloaliphatic hydrocarbon group (a cycloalkyl group) (for example, a cyclopentyl group, a cyclohexyl group, a cyclopentylmethyl group, a cyclopentylethyl group, a cyclopentylbutyl group, a cyclohexylmethyl group, a cyclohexylethyl group, a cyclohexylbutyl group, a 1-adamantyl group, a 2-adamantyl group, a 1-adamantylmethyl group, a norbornyl group, a norbornylmethyl group, a tricyclodecanyl group, a tetracyclododecanyl group, a tetracyclododecanylmethyl group, and a dicyclohexylmethyl group; a monovalent unsaturated aliphatic hydrocarbon group (an alkenyl group, and an alkynyl group) (for example, an allyl group); a monovalent unsaturated cycloaliphatic hydrocarbon group (a cycloalkenyl group) (for example, 3-cyclohexenyl); an aryl group (for example, a phenyl group, a 1-naphthyl group, and a 2-naphthyl group); an arylalkyl group (for example, a benzyl group, and a diphenylmethyl group); a monovalent hydrocarbon group containing one or more heteroatoms (for example, a tetrahydrofuranyl group, a methoxymethyl group, a ethoxymethyl group, a methylthiomethyl group, an acetamidemethyl group, a trifluoroethyl group, a (2-methoxyethoxy)methyl group, an acetoxymethyl group, a 2-carboxy-1-cyclohexyl group, a 2-oxopropyl group, a 4-oxo-1-adamantyl group, and a 3-oxocyclohexyl group), or any combination thereof. In addition, in these groups, some hydrogen atoms may be substituted with a moiety containing one or more heteroatoms such as oxygen, sulfur, nitrogen, or a halogen atom, or some carbon atoms may be replaced by a moiety containing one or more heteroatoms such as oxygen, sulfur, or nitrogen, and thus, these groups may contain a hydroxyl group, a cyano group, a carbonyl group, a carboxyl group, an ether bond, an ester bond, a sulfonic acid ester bond, a carbonate, a lactone ring, a sultone ring, a carboxylic acid anhydride moiety, or a haloalkyl moiety.

The term "divalent hydrocarbon group" as used herein refers to a divalent moiety, in which any one hydrogen of the monovalent hydrocarbon group is replaced by a bonding site with an adjacent atom. The divalent hydrocarbon group may include, for example, a linear or branched alkylene group, a cycloalkylene group, an alkenylene group, an alkynylene group, a cycloalkylene group, an arylene group, groups in which some carbon atoms of the aforementioned groups are replaced by heteroatoms, and the like.

The term "alkyl group" as used herein refers to a linear or branched saturated aliphatic hydrocarbon monovalent group, and specific examples thereof include a methyl group, an ethyl group, a propyl group, an isobutyl group, a sec-butyl group, a ter-butyl group, a pentyl group, an isoamyl group, a hexyl group, and the like. The term "alkylene group" as used herein refers to a linear or branched saturated aliphatic hydrocarbon divalent group, and specific examples thereof include a methylene group, an ethylene group, a propylene group, a butylene group, an isobutylene group, and the like.

The term "halogenated alkyl group" as used herein refers a group in which one or more hydrogen atoms of the alkyl group are substituted with halogens, and specific examples thereof include $CF_3$ and the like.

The term "alkoxy group" as used herein refers to a monovalent group having a formula of $—OA_{101}$, wherein $A_{101}$ is an alkyl group. Specific examples thereof include a methoxy group, an ethoxy group, an isopropyloxy group, and the like.

The term "alkylthio group" as used herein refers to a monovalent group having a formula of $—SA_{101}$, wherein $A_{101}$ is an alkyl group.

The term "halogenated alkoxy group" as used herein refers to a group in which one or more hydrogens of the alkoxy group are substituted with halogens, and specific examples include $—OCF_3$ and the like.

The term "halogenated alkylthio group" as used herein refers to a group in which one or more hydrogens of the alkylthio group are substituted with halogens, and specific examples include $—SCF_3$ and the like.

The term "cycloalkyl group" as used herein refers to a monovalent saturated hydrocarbon cyclic group, and specific examples thereof include monocyclic groups such as a cyclopropyl group, a cyclobutyl group, a cyclopentyl group, a cyclohexyl group, a cycloheptyl group, and the like, and polycyclic condensed cyclic groups such as a norbornyl group, and an adamantyl group. The term "cycloalkylene group" as used herein refers to a divalent saturated hydrocarbon cyclic group, and specific examples thereof include a cyclopentylene group, a cyclohexylene group, an adamantylene group, an adamantylmethylene group, a norbornylene group, a norbornylmethylene group, a tricyclodecanylene group, a tetracyclododecanylene group, a tetracyclododecanylmethylene group, a dicyclohexylmethylene group, and the like.

The term "cycloalkoxy group" as used herein refers to a monovalent group having a formula of —$OA_{102}$, wherein $A_{102}$ is a cycloalkyl group. Specific examples thereof include a cyclopropoxy group, a cyclobutoxy group, and the like.

The term "cycloalkylthio group" as used herein refers to a monovalent group having a formula of —$SA_{102}$, wherein $A_{102}$ is a cycloalkyl group.

The term "heterocycloalkyl group" as used herein refers to a group having one or more carbon atoms in the cycloalkyl groups replaced by heteroatoms, for example, moieties containing oxygen, sulfur, or nitrogen. Heterocycloalkyl groups may contain, in particular, an ether bond, an ester bond, a sulfonic acid ester bond, a carbonate, a lactone ring, a sultone ring, or a carboxylic acid anhydrous moiety. The term "heterocycloalkylene group" as used herein refers to a group having one or more carbon atoms in the cycloalkylene groups replaced by moieties containing oxygen, sulfur, or nitrogen, for example.

The term "heterocycloalkoxy group" as used herein refers to a monovalent group having a formula of —$OA_{103}$, wherein $A_{103}$ is a heterocycloalkyl group.

The term "alkenyl" as used herein as used herein refers to a linear or branched unsaturated aliphatic hydrocarbon monovalent group including one or more carbon-carbon double bonds. The term "alkenylene group" as used herein refers to a linear or branched unsaturated aliphatic hydrocarbon divalent group including at least one carbon-carbon double bond.

The term "alkenyloxy group" as used herein refers to a monovalent group having a formula of —$OA_{104}$, wherein $A_{104}$ is an alkenyl group.

The term "cycloalkenyl group" as used herein refers to a monovalent unsaturated hydrocarbon cyclic group including one or more carbon-carbon double bonds. The term "cycloalkenylene group" as used herein refers to a divalent unsaturated hydrocarbon cyclic group including one or more carbon-carbon double bonds.

The term "cycloalkenyloxy group" as used herein refers to a monovalent group having a formula of —$OA_{105}$, where $A_{105}$ is a cycloalkenyl group.

In the present specification, "heterocycloalkenyl group" refers to a group in which some carbon atoms of the cycloalkenyl group are replaced by a moiety including one or more heteroatoms, such as oxygen, sulfur, or nitrogen. The term "heterocycloalkenylene group" as used herein refers to a group in which some carbon atoms of the cycloalkenylene group are replaced by a moiety including one or more heteroatoms, such as oxygen, sulfur, or nitrogen.

The term "heterocycloalkenyloxy group" as used herein refers to a monovalent group having a formula of —$OA_{106}$, wherein $A_{106}$ is a heterocycloalkenyl group.

The term "alkynyl group" as used herein refers to a linear or branched unsaturated aliphatic hydrocarbon monovalent group including one or more carbon-carbon triple bonds.

The term "alkynyloxy group" as used herein refers to a monovalent group having a formula of —$OA_{107}$, wherein $A_{107}$ is an alkynyl group.

The term "aryl group" as used herein refers to a monovalent group having a carbocyclic aromatic system, and specific examples thereof include a phenyl group, a naphthyl group, an anthracenyl group, a phenanthrenyl group, a pyrenyl group, a chrysenyl group, and the like.

The term "aryloxy group" as used herein refers to a monovalent group having a formula of —$OA_{108}$, wherein $A_{108}$ is an aryloxy group.

The term "heteroaryl group" as used herein refers to a monovalent group having a heterocyclic aromatic system, and specific examples include a pyridinyl group, a pyrimidinyl group, a pyrazinyl group, and the like. The term "heteroarylene group" as used herein refers to a divalent group having a heterocyclic aromatic system.

The term "heteroaryloxy group" as used herein refers to a monovalent group having a formula of —$OA_{109}$, wherein $A_{109}$ is a heteroaryl group.

As used herein, when a definition is not otherwise provided, "substituted" refers to replacement of hydrogen of a compound by a substituent of a halogen, a hydroxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a $C_1$ to $C_{30}$ alkyl group, a $C_2$ to $C_{30}$ alkenyl group, a $C_2$ to $C_{30}$ alkynyl group, a $C_6$ to $C_{30}$ aryl group, a $C_7$ to $C_{30}$ arylalkyl group, a $C_1$ to $C_{30}$ alkoxy group, a $C_1$ to $C_{20}$ heteroalkyl group, a $C_3$ to $C_{20}$ heterocyclic group, a $C_3$ to $C_{20}$ heteroarylalkyl group, a $C_3$ to $C_{30}$ cycloalkyl group, a $C_3$ to $C_{15}$ cycloalkenyl group, a $C_6$ to $C_{15}$ cycloalkynyl group, a $C_3$ to $C_{30}$ heterocycloalkyl group, or any combination thereof.

As used herein, when a definition is not otherwise provided, "hetero" refers to one including 1 to 4 heteroatoms of N, O, S, Se, Te, Si, or P. As referred to herein, one or more heteroatoms may be N, O, S, Se, Te, Si, or P.

As used herein, when a definition is not otherwise provided, "aromatic ring" refers to a functional group in which all atoms in the cyclic functional group have a p-orbital, and wherein these p-orbitals are conjugated.

The term "substituent group" as used herein may include deuterium, a halogen, a hydroxyl group, a cyano group, a nitro group, a carbonyl group, a carboxylic acid group, an amino group, an ether moiety, an ester moiety, a sulfonic acid ester moiety, a carbonate moiety, an amide moiety, a lactone moiety, a sultone moiety, a carboxylic acid anhydride moiety, a $C_1$-$C_{20}$ alkyl group, a $C_1$-$C_{20}$ halogenated alkyl group, a $C_1$-$C_{20}$ alkoxy group, a $C_1$-$C_{20}$ alkylthio group, a $C_1$-$C_{20}$ halogenated alkoxy group, a $C_1$-$C_{20}$ halogenated alkylthio group, a $C_3$-$C_{20}$ cycloalkyl group, a $C_3$-$C_{20}$ cycloalkoxy group, a $C_3$-$C_{20}$ cycloalkylthio group, a $C_6$-$C_{20}$ aryl group, a $C_6$-$C_{20}$ aryloxy group, a $C_6$-$C_{20}$ arylthio group, a $C_1$-$C_{20}$ heteroaryl group, a $C_1$-$C_{20}$ heteroaryloxy group, or a $C_1$-$C_{20}$ heteroarylthio group; a $C_1$-$C_{20}$ alkyl group, a $C_1$-$C_{20}$ halogenated alkyl group, a $C_1$-$C_{20}$ alkoxy group, a $C_1$-$C_{20}$ alkylthio group, a $C_1$-$C_{20}$ halogenated alkoxy group, a $C_1$-$C_{20}$ halogenated alkylthio group, a $C_3$-$C_{20}$ cycloalkyl group, a $C_3$-$C_{20}$ cycloalkoxy group, a $C_3$-$C_{20}$ cycloalkylthio group, a $C_6$-$C_{20}$ aryl group, a $C_6$-$C_{20}$ aryloxy group, a $C_6$-$C_{20}$ arylthio group, a $C_1$-$C_{20}$ heteroaryl group, a $C_1$-$C_{20}$ heteroaryloxy group, or a $C_1$-$C_{20}$ heteroarylthio group, which may each be substituted with deuterium, a halogen, a hydroxyl group, a cyano group, a nitro group, a carbonyl group, a carboxylic acid group, an amino group, an ether moiety, an ester moiety, a sulfonic acid ester moiety, a carbonate moiety, an amide moiety, a lactone moiety, a sultone moiety, a carboxylic acid anhydride moiety, a $C_1$-$C_{20}$ alkyl group, a $C_1$-$C_{20}$ halogenated alkyl group, a $C_1$-$C_{20}$ alkoxy group, a $C_1$-$C_{20}$ alkylthio group, a $C_1$-$C_{20}$ halogenated alkoxy group, a $C_1$-$C_{20}$ halogenated alkylthio group, a $C_3$-$C_{20}$ cycloalkyl group, a $C_3$-$C_{20}$ cycloalkoxy group, a $C_3$-$C_{20}$ cycloalkylthio group, a $C_6$-$C_{20}$ aryl group, a $C_6$-$C_{20}$ aryloxy group, a $C_6$-$C_{20}$ arylthio group, a $C_1$-$C_{20}$ heteroaryl group, a $C_1$-$C_{20}$ heteroaryloxy group, or a $C_1$-$C_{20}$ heteroarylthio group; or any combination thereof.

Hereinafter, some example embodiments of the inventive concepts are described in detail with reference to the accompanying drawings, and when describing the inventive concepts with reference to the drawings, substantially identical or corresponding components are given the same reference numerals, and redundant descriptions will be omitted. In the drawings, thicknesses are shown enlarged to clearly express various layers and regions. In addition, in the drawings, the thicknesses of some layers and regions are exaggerated for convenience of description. Meanwhile, some example embodiments described below are merely examples, and various modifications are possible from these examples.

Resist Composition-Polymer Included

A resist composition according to some example embodiments may include an organometallic compound represented by Formula 1; and a polymer including a repeating unit represented by Formula 2 below:

Formula 1

$M_{11}(R_{11})_n(OR_{12})_{(4-n)}$,

Formula 2

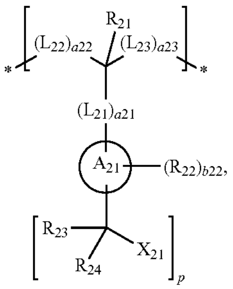

wherein, in Formulas 1 and 2, $M_{11}$ may be indium (In), tin (Sn), antimony (Sb), tellurium (Te), thallium (Tl), lead (Pb), bismuth (Bi), silver (Ag), or polonium (Po), $R_{11}$ may be a linear, branched, or cyclic $C_1$-$C_{30}$ monovalent hydrocarbon group optionally containing one or more heteroatoms, $R_{12}$ may be a linear, branched, or cyclic monovalent $C_1$-$C_{30}$ hydrocarbon group optionally containing one or more heteroatoms, or may be $*$-$M_{12}(R_{13})_m(OR_{14})_{(3-m)}$, n may be an integer of 1 to 4, $M_{12}$ may be indium (In), tin (Sn), antimony (Sb), tellurium (Te), thallium (Tl), lead (Pb), bismuth (Bi), silver (Ag), or polonium (Po), $R_{13}$ and $R_{14}$ may each independently be a linear, branched, or cyclic $C_1$-$C_{30}$ monovalent hydrocarbon group optionally containing one or more heteroatoms, m may be an integer of 0 to 3, $L_{21}$ to $L_{23}$ may each independently be a single bond, O, S, C(═O), C(═O)O, OC(═O), C(═O)NH, NHC(═O), or a linear, branched, or cyclic $C_1$-$C_{30}$ divalent hydrocarbon group optionally containing one or more heteroatoms, or any combination thereof, a21 to a23 may each independently be an integer of 1 to 4, $A_{21}$ may be a $C_1$-$C_{30}$ aryl group or a $C_1$-$C_{30}$ heteroaryl group, $R_{21}$ to $R_{24}$ may each independently be hydrogen, deuterium, a halogen, or a linear, branched, or cyclic $C_1$-$C_{30}$ monovalent hydrocarbon group optionally containing one or more heteroatoms, b22 may be an integer of 1 to 10, p may be an integer of 1 to 10, $X_{21}$ may be a leaving group, and * is a binding site with a neighboring atom. In Formula 2, * is a binding site with a neighboring atom of an adjacent repeating unit of the polymer. A quantity of repeating units in the polymer may be any integer, for example any quantity equal to or greater than 2. In some example embodiments of Formula 1 where $R_{12}$ is $*$-$M_{12}(R_{13})_m(OR_{14})_{(3-m)}$, * of $*$-$M_{12}(R_{13})_m(OR_{14})_{(3-m)}$ is a binding site with a neighboring atom of Formula 1.

The organometallic compound may have a molecular weight of about 3,000 g/mol or less, specifically, about 100 g/mol or more to about 1,000 g/mol or less. The organometallic compound is not a polymer, and is distinguished from a polymer, in which any repeating unit contains a metal.

In Formula 1, a bond between $M_{11}$ and $R_{11}$ may be an $M_{11}$-carbon single bond, and a bond between $M_{12}$ and $R_{13}$ is an $M_{12}$-carbon single bond. While $M_{11}$ and $R_{12}$, and $M_{12}$ and $R_{14}$ of the organometallic compound may be each bonded through oxygen atoms, in $R_{11}$ and $R_{13}$, carbon atoms included in $R_{11}$ and $R_{13}$ may be bonded to $M_{11}$ and $M_{12}$, respectively.

For example, in Formula 1, $M_{11}$ and $M_{12}$ may each independently be Sn, Sb, Te, Bi, or Ag.

Specifically, in Formula 1, $M_{11}$ and $M_{12}$ may each independently be Sn.

For example, in Formula 1, $M_{11}$ and $M_{12}$ may be the same, or different from each other.

Specifically, in Formula 1, $M_{11}$ and $M_{12}$ may be the same.

For example, in Formula 1, $R_{11}$ and $R_{13}$ may each independently be represented by $*$-$(L_{11})_{a11}$-$X_{11}$, $R_{12}$ and $R_{14}$ may each independently be represented by $*$-$(L_{12})_{a12}$-$X_{12}$, $L_{11}$ and $L_{12}$ may each independently be $CR_aR_b$, C═O, S═O, $SO_2$, $PO_2$, or $PO_3$, a11 and a12 may each independently be an integer of 0 to 3, $X_{11}$ and $X_{12}$ may each independently be, a substituted or unsubstituted $C_1$-$C_{30}$ alkyl group, a substituted or unsubstituted $C_1$-$C_{30}$ halogenated alkyl group, a substituted or unsubstituted $C_1$-$C_{30}$ alkoxy group, a substituted or unsubstituted $C_1$-$C_{30}$ alkylthio group, a substituted or unsubstituted $C_1$-$C_{30}$ halogenated alkoxy group, a substituted or unsubstituted $C_1$-$C_{30}$ halogenated alkylthio group, a substituted or unsubstituted $C_3$-$C_{30}$ cycloalkyl group, a substituted or unsubstituted $C_3$-$C_{30}$ cycloalkoxy group, a substituted or unsubstituted $C_3$-$C_{30}$ cycloalkylthio group, a substituted or unsubstituted $C_3$-$C_{30}$ heterocycloalkyl group, a substituted or an unsubstituted $C_3$-$C_{30}$ heterocycloalkoxy group, a substituted or unsubstituted $C_3$-$C_{30}$ heterocycloalkylthio group, a substituted or unsubstituted $C_2$-$C_{30}$ alkynyl group, a substituted or unsubstituted $C_2$-$C_{30}$ alkynyloxy group, a substituted or unsubstituted $C_2$-$C_{30}$ alkynylthio group, a substituted or unsubstituted $C_6$-$C_{30}$ aryl group, a substituted or unsubstituted substituted or unsubstituted $C_6$-$C_{30}$ aryloxy group, a substituted or unsubstituted $C_6$-$C_{30}$ arylthio group, a substituted or unsubstituted $C_1$-$C_{30}$ heteroaryl group, a substituted or unsubstituted $C_1$-$C_{30}$ heteroaryloxy group, or a substituted or unsubstituted $C_1$-$C_{30}$ heteroarylthio group, $R_a$ and $R_b$ may each independently be hydrogen, deuterium, a hydroxyl group, a cyano group, a nitro group, a substituted or unsubstituted $C_1$-$C_{30}$ alkyl group, a substituted or unsubstituted $C_1$-$C_{30}$ alkoxy group, a substituted or unsubstituted $C_1$-$C_{30}$ alkylthio group, a substituted or unsubstituted $C_3$-$C_{30}$ cycloalkyl group, a substituted or unsubstituted $C_3$-$C_{30}$ cycloalkoxy group, or a substituted or unsubstituted $C_3$-$C_{30}$ cycloalkylthio group, and

* is a binding site with a neighboring atom (e.g., a neighboring atom of Formula 1). In some example embodiments, in Formula 1, $R_{11}$ is represented by $*$-$(L_{11})_{a11}$-$X_{11}$, and $R_{12}$ is represented by $*$-$(L_{12})_{a12}$-$X_{12}$, where a11, a12, $X_{11}$, $X_{12}$, and * are the same as described above.

In some example embodiments, $L_{11}$ may be $CR_aR_b$ or C═O, and $L_{12}$ may be C═O, S═O, $SO_2$, $PO_2$, $PO_3$, or $NO_2$.

In some example embodiments, $X_{11}$ and $X_{12}$ may each independently be a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, a substituted or unsubstituted $C_6$-$C_{30}$ aryloxy group, a substituted or unsubstituted $C_1$-$C_{30}$ heteroaryl group, or a substituted or unsubstituted $C_1$-$C_{30}$ heteroaryloxy group.

In some example embodiments, $X_{11}$ and $X_{12}$ may each independently be a $C_1$-$C_{20}$ alkyl group unsubstituted or substituted with at least one selected from deuterium, a halogen, a hydroxyl group, a $C_1$-$C_6$ alkyl group, a $C_1$-$C_6$ halogenated alkyl group, a $C_1$-$C_6$ alkoxy group, a $C_1$-$C_6$ halogenated alkoxy group, a $C_1$-$C_6$ halogenated alkylthio group, a $C_3$-$C_6$ cycloalkyl group, a $C_3$-$C_6$ cycloalkoxy group, a $C_3$-$C_6$ cyclokylthio group, and a $C_6$-$C_{10}$ aryl group; or a $C_6$-$C_{20}$ aryl group unsubstituted or substituted with at least one selected from deuterium, a halogen, a hydroxyl group, a $C_1$-$C_6$ alkyl group, a $C_1$-$C_6$ halogenated alkyl group, a $C_1$-$C_6$ alkoxy group, a $C_1$-$C_6$ halogenated alkoxy group, a $C_1$-$C_6$ halogenated alkylthio group, a $C_3$-$C_6$ cycloalkyl group, a $C_3$-$C_6$ cycloalkoxy group, a $C_3$-$C_6$ cyclokylthio group, and a $C_6$-$C_{10}$ aryl group.

In some example embodiments, $L_{11}$ may be $CR_aR_b$ or C═O, $L_{12}$ may be C═O, S═O, $SO_2$, $PO_2$, $PO_3$, or $NO_2$, a11 and a12 may each independently be 0, or 1, and $X_{11}$ and $X_{12}$ may each independently be a $C_1$-$C_{20}$ alkyl group unsubstituted or substituted with at least one selected from deuterium, a halogen, a hydroxyl group, a $C_1$-$C_6$ alkyl group, a $C_1$-$C_6$ halogenated alkyl group, a $C_1$-$C_6$ alkoxy group, a $C_1$-$C_6$ halogenated alkoxy group, a $C_1$-$C_6$ halogenated alkylthio group, a $C_3$-$C_6$ cycloalkyl group, a $C_3$-$C_6$ cycloalkoxy group, a $C_3$-$C_6$ cyclokylthio group, and a $C_6$-$C_{10}$ aryl group; or a $C_6$-$C_{20}$ aryl group unsubstituted or substituted with at least one selected from deuterium, a halogen, a hydroxyl group, a $C_1$-$C_6$ alkyl group, a $C_1$-$C_6$ halogenated alkyl group, a $C_1$-$C_6$ alkoxy group, a $C_1$-$C_6$ halogenated alkoxy group, a $C_1$-$C_6$ halogenated alkylthio group, a $C_3$-$C_6$ cycloalkyl group, a $C_3$-$C_6$ cycloalkoxy group, a $C_3$-$C_6$ cyclokylthio group, and a $C_6$-$C_{10}$ aryl group.

Specifically, the organometallic compound may be represented by any one of Formulas 1-1 to 1-16:

1-1

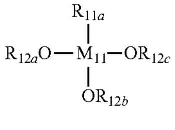

1-2

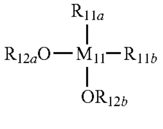

-continued 1-3

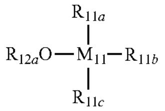

1-4

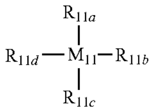

1-5

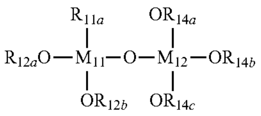

1-6

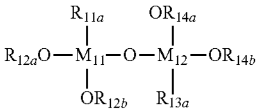

1-7

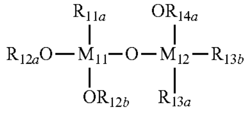

1-8

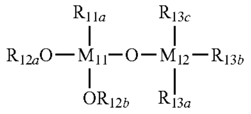

1-9

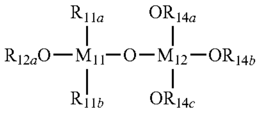

1-10

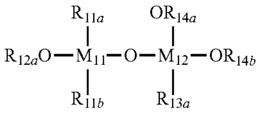

1-11

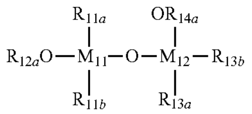

1-12

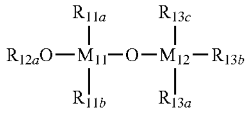

1-13

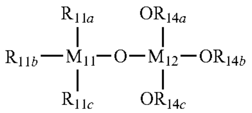

1-14

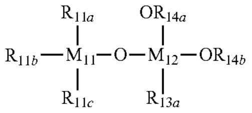

1-15

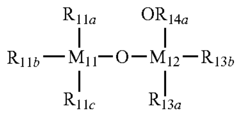

-continued 1-16

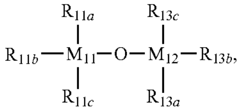

wherein, in Formulas 1-1 to 1-16, $M_{11}$ and $M_{12}$ may each refer to the definitions for Formula 1, $R_{11a}$ to $R_{11d}$ may refer to the definition of $R_{11}$ for Formula 1, $R_{12a}$ to $R_{12c}$ may refer to the definition of $R_{12}$ for Formula 1 above, $R_{13a}$ to $R_{13c}$ may refer to the definition of $R_{13}$ for Formula 1, and $R_{14a}$ to $R_{14c}$ may refer to the definition of $R_{14}$ for Formula 1. For example, in Formulas 1-1 to 1-16, $M_{11}$ and $M_{12}$ may each independently be indium (In), tin (Sn), antimony (Sb), tellurium (Te), thallium (Tl), lead (Pb), bismuth (Bi), silver (Ag), or polonium (Po), $R_{11a}$ to $R_{11d}$ may each independently be a linear, branched, or cyclic $C_1$-$C_{30}$ monovalent hydrocarbon group optionally containing one or more heteroatoms, $R_{12a}$ to $R_{12c}$ may each independently be a linear, branched, or cyclic $C_1$-$C_{30}$ monovalent hydrocarbon group optionally containing one or more heteroatoms or is $*\text{-}M_{12}(R_{13})_m(OR_{14})_{(3-m)}$, wherein $M_{12}$ is indium (In), tin (Sn), antimony (Sb), tellurium (Te), thallium (Tl), lead (Pb), bismuth (Bi), silver (Ag), or polonium (Po), $R_{13}$ and $R_{14}$ are each independently a linear, branched, or cyclic $C_1$-$C_{30}$ monovalent hydrocarbon group optionally containing one or more heteroatoms, m is an integer of 0 to 3, and * is a binding site with a neighboring atom, $R_{13a}$ to $R_{13c}$ may each independently be a linear, branched, or cyclic $C_1$-$C_{30}$ monovalent hydrocarbon group optionally containing one or more heteroatoms, and $R_{14a}$ to $R_{14c}$ may each independently be a linear, branched, or cyclic $C_1$-$C_{30}$ monovalent hydrocarbon group optionally containing one or more heteroatoms.

More specifically, the organometallic compound may be represented by any one of Formulas 1-1 to 1-4.

In particular, the organometallic compound may be selected from Group I below:

Group I

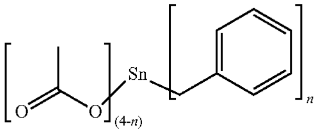

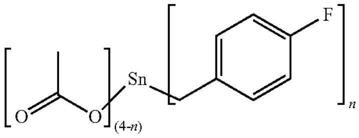

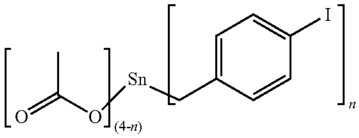

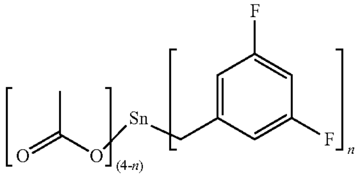

-continued

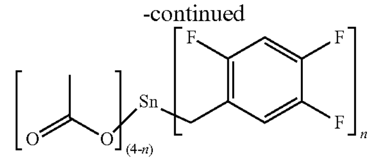

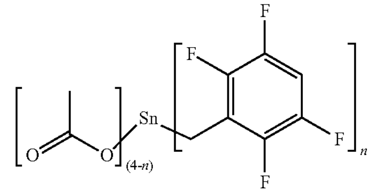

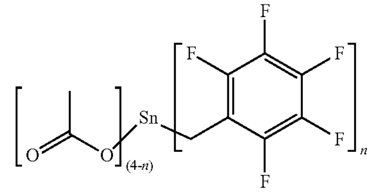

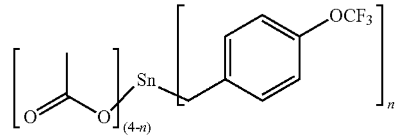

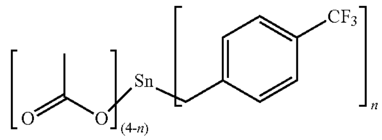

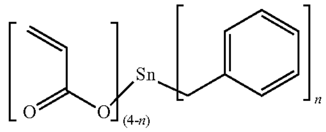

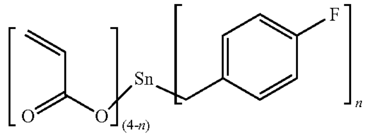

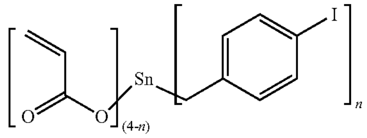

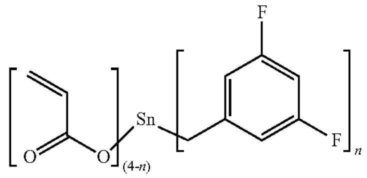

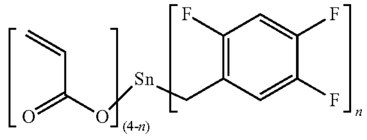

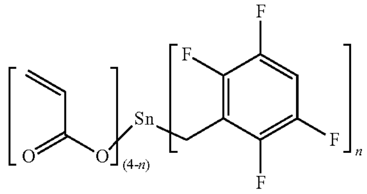

-continued

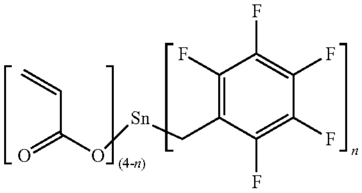

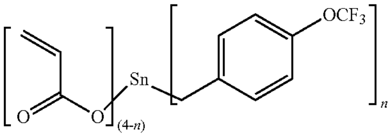

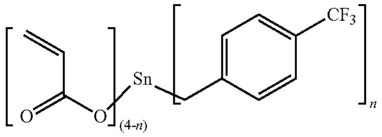

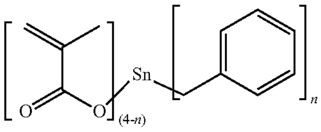

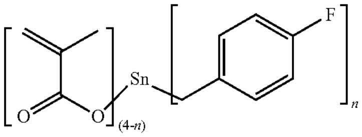

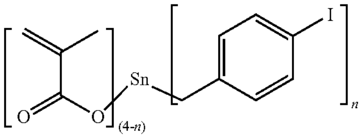

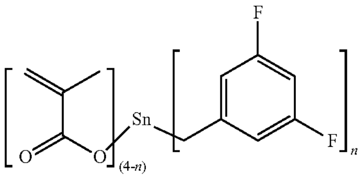

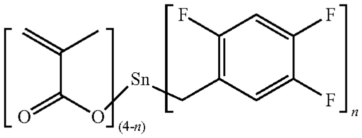

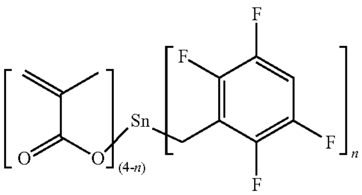

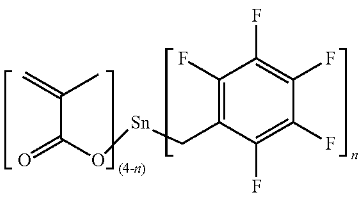

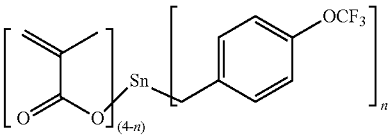

-continued

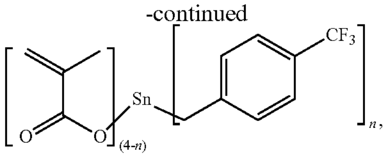

wherein, in Group I, n is an integer of 1 to 4.

For example, in Group I, n may be 2.

The polymer may not substantially include a repeating unit of which structure is changed by an acid. For example, the polymer may not include any repeating unit of which structure is changed by an acid. Here, the repeating unit of which structure is changed by an acid refers to a repeating unit including an acid labile group. Accordingly, the polymer may not include any repeating unit that includes any acid labile group. The acid labile group may refer to an ester group having a tertiary acyclic alkyl carbon, an ester group containing a tertiary alicyclic carbon, or a cyclic acetal. The acid labile group is released from the polymer by an acid and act to make the polymer to be more readily soluble in a developing solution, such as a tetramethyl ammonium hydroxide (TMAH) aqueous solution.

For example, in Formula 2, a21 to a23 may each independently be an integer of 1 to 3.

For example, in Formula 2, $L_{21}$ to $L_{23}$ may each independently be a single bond, O, S, C(═O), C(═O)O, OC(═O), C(═O)NH, NHC(═O), a substituted or unsubstituted $C_1$-$C_{30}$ alkylene group, a substituted or unsubstituted $C_3$-$C_{30}$ cycloalkylene group, a substituted or unsubstituted $C_1$-$C_{30}$ heterocycloalkylene group, a substituted or unsubstituted phenylene group, a substituted or unsubstituted naphthylene group, or any combination thereof.

For example, in Formula 2, $A_{21}$ may be a benzene group, a naphthalene group, a phenanthrene group, an anthracene group, a chrysene group, a pyrene group, a triphenylene group, a fluorene group, a pyrrole group, a furan group, a thiophene group, an imidazole group, an oxazole group, a thiazole group, a pyridine group, a pyrazine group, a triazine group, a quinoline group, an isoquinoline group, a benzoquinoline group, a quinoxaline group, a quinazoline group, a cinoline group, a phenanthroline group, a phenanthridine group, an indole group, a benzofuran group, a benzothiophene group, a benzimidazole group, a benzoxazole group, a benzothiazole group, a carbazole group, a dibenzofuran group, or a dibenzothiophene group.

Specifically, in Formula 2, $A_{21}$ may be a benzene group, a naphthalene group, a phenanthrene group, an anthracene group, a chrysene group, a pyrene group, a triphenylene group, or a fluorene group.

For example, in Formula 2, $R_{21}$ to $R_{24}$ may each independently be hydrogen, deuterium, a halogen, a $C_1$-$C_{20}$ alkyl group, a $C_1$-$C_{20}$ halogenated alkyl group, a $C_1$-$C_{20}$ alkoxy group, a $C_3$-$C_{20}$ cycloalkyl group, a $C_3$-$C_{20}$ cycloalkoxy group, or a $C_6$-$C_{20}$ aryl group.

In some example embodiments, in Formula 2, $R_{23}$ and $R_{24}$ may each independently be hydrogen or deuterium.

In some example embodiments, in Formula 2, $R_{23}$ may be hydrogen, or deuterium, and $R_{24}$ may be a $C_1$-$C_{20}$ alkyl group, a $C_1$-$C_{20}$ halogenated alkyl group, a $C_1$-$C_{20}$ alkoxy group, a $C_3$-$C_{20}$ cycloalkyl group, a $C_3$-$C_{20}$ cycloalkoxy group, or a $C_6$-$C_{20}$ aryl group.

Specifically, in Formula 2, $R_{22}$ may be hydrogen, deuterium, F, $CH_3$, $CH_2F$, $CHF_2$, $CF_3$, $CH_2CH_3$, $CHFCH_3$, $CHFCH_2F$, $CHFCHF_2$, $CHFCF_3$, $CF_2CH_3$, $CF_2CH_2F$, $CF_2CHF_2$, or $CF_2CF_3$.

For example, in Formula 2, $X_{21}$ may be an ammonium salt, a phosphonium salt, a sulfonium salt, a selenonium salt, an iodonium salt, a halogen, $R_{31}SO_3$, $R_{31}CO_2$, $R_{31}PO_2(OR_{32})$, or $NO_3$, and $R_{31}$ and $R_{32}$ may each independently be a linear, branched, or cyclic $C_1$-$C_{30}$ monovalent hydrocarbon group optionally containing one or more heteroatoms.

Specifically, in Formula 2, $X_{21}$ may be a group represented by any one of Formulas 3-1 to 3-3, Cl, Br, I, $R_{31}SO_3$, $R_{31}CO_2$, $R_{31}PO_2(OR_{32})$, or $NO_3$, $R_{31}$ and $R_{32}$ may each independently be a linear, branched, or cyclic $C_1$-$C_{30}$ monovalent hydrocarbon group optionally containing one or more heteroatoms:

3-1

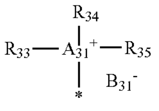

3-2

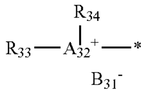

3-3

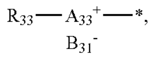

wherein, in Formulas 3-1 to 3-3, $A_{31}$ may be N or P, $A_{32}$ may be S or Se, $A_{33}$ may be I, and $B_{31}^-$ may be a counter anion, $R_{33}$ to $R_{35}$ may each independently be a linear, branched, or cyclic $C_1$-$C_{30}$ monovalent hydrocarbon group optionally containing one or more heteroatoms, two adjacent groups of $R_{33}$ to $R_{35}$ may optionally bond to each other to form a ring (e.g., any two adjacent groups of $R_{33}$ to $R_{35}$ may be independently present or may be bonded to each other to form a ring, and * is a binding site with a neighboring atom (e.g., a neighboring atom of Formula 2).

For example, in Formulas 3-1 to 3-3, $B_{31}^-$ may be a halogen ion, $R_{36}SO_3^-$, $R_{36}CO_2^-$, $R_{36}PO_4^-$, $PF_6^-$, or $BF_4^-$, and $R_{36}$ may be a linear, branched, or cyclic $C_1$-$C_{20}$ monovalent hydrocarbon group optionally containing one or more heteroatoms.

More specifically, in Formula 2, $X_{21}$ may be a group represented by Formula 3-2 below, Cl, Br, I, $R_{31}SO_3$, $R_{31}CO_2$, $R_{31}PO_2(OR_{32})$, or $NO_3$, and $R_{31}$ and $R_{32}$ may each independently be a $C_1$-$C_{20}$ alkyl group unsubstituted or substituted with at least one selected from deuterium, a halogen, a hydroxyl group, a $C_1$-$C_6$ alkyl group, a $C_1$-$C_6$ halogenated alkyl group, a $C_1$-$C_6$ alkoxy group, a $C_3$-$C_6$ cycloalkyl group, a $C_3$-$C_6$ cycloalkoxy group, and a $C_6$-$C_{10}$ aryl group; or a $C_6$-$C_{10}$ aryl group unsubstituted or substituted with at least one selected from deuterium, a halogen, a hydroxyl group, a $C_1$-$C_6$ alkyl group, a $C_1$-$C_6$ halogenated alkyl group, a $C_1$-$C_6$ alkoxy group, a $C_3$-$C_6$ cycloalkyl group, a $C_3$-$C_6$ cycloalkoxy group, and a $C_6$-$C_{10}$ aryl group:

3-2

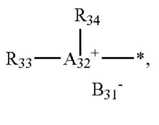

wherein, in Formula 3-2, $A_{32}$ may be S, $B_{31}^-$ may be $Cl^-$, $Br^-$, $I^-$, $R_{36}SO_3^-$, or $R_{36}CO_2^-$, $R_{33}$, $R_{34}$, and $R_{36}$ may each independently be a $C_1$-$C_{20}$ alkyl group unsubstituted or substituted with at least one selected from deuterium, a halogen, a hydroxyl group, a $C_1$-$C_6$ alkyl group, a $C_1$-$C_6$ halogenated alkyl group, a $C_1$-$C_6$ alkoxy group, a $C_3$-$C_6$ cycloalkyl group, a $C_3$-$C_6$ cycloalkoxy group, and a $C_6$-$C_{10}$ aryl group; or a $C_6$-$C_{10}$ aryl group unsubstituted or substituted with at least one selected from deuterium, a halogen, a hydroxyl group, a $C_1$-$C_6$ alkyl group, a $C_1$-$C_6$ halogenated alkyl group, a $C_1$-$C_6$ alkoxy group, a $C_3$-$C_6$ cycloalkyl group, a $C_3$-$C_6$ cycloalkoxy group, and a $C_6$-$C_{10}$ aryl group, $R_{33}$ and $R_{34}$ may optionally bind to each other to form a ring, and * is a binding site with a neighboring atom (e.g., a neighboring atom of Formula 2).

In particular, in Formula 2, $X_{21}$ may be a group represented by any one of Formulas 3-11 to 3-13, Cl, Br, I, $R_{31}SO_3$, or $R_{31}CO_2$:

3-11

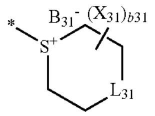

3-12

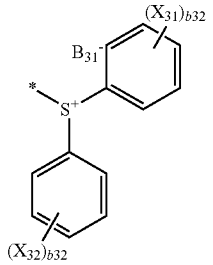

3-13

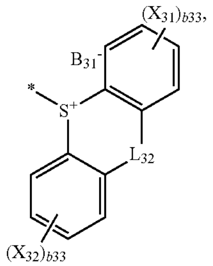

wherein, in Formulas 3-11 to 3-13, $L_{31}$ and $L_{32}$ may each independently be, a single bond, O, S, CO, SO, $SO_2$, CRR', or NR, R and R' may each independently be hydrogen, deuterium, a halogen, a hydroxyl group, a $C_1$-$C_{20}$ alkyl group, a $C_1$-$C_{20}$ halogenated alkyl group, a $C_1$-$C_{20}$ alkoxy group, a $C_3$-$C_{20}$ cycloalkyl group, or a $C_3$-$C_{20}$ cycloalkoxy group, $X_{31}$ and $X_{32}$ may each independently be hydrogen, a halogen, a $C_1$-$C_{20}$ alkyl group unsubstituted or substituted with at least one selected from deuterium, a halogen, a hydroxyl group, a $C_1$-$C_6$ alkyl group, a $C_1$-$C_6$ halogenated alkyl group, a $C_1$-$C_6$ alkoxy group, a $C_3$-$C_6$ cycloalkyl group, a $C_3$-$C_6$ cycloalkoxy group, and a $C_6$-$C_{10}$ aryl group; or a $C_6$-$C_{10}$ aryl group unsubstituted or substituted with at least one selected from deuterium, a halogen, a hydroxyl group, a $C_1$-$C_6$ alkyl group, a $C_1$-$C_6$ halogenated alkyl group, a $C_1$-$C_6$ alkoxy group, a $C_3$-$C_6$ cycloalkyl group, a $C_3$-$C_6$ cycloalkoxy group, and a $C_6$-$C_{10}$ aryl group, b31 may be an integer of 1 to 8, b32 may be an integer of 1 to 5, b33 may be an integer of 1 to 4, $B_{31}^-$ may be $Cl^-$, $Br^-$, $I^-$, $R_{36}SO_3^-$, or $R_{36}CO_2^-$, and * is a binding site with a neighboring atom (e.g., a neighboring atom of Formula 2).

For example, in Formulas 3-11 to 3-13, $L_{31}$ and $L_{32}$ may each independently be a single bond or CRR'.

For example, in Formulas 3-11 to 3-13, $X_{31}$ and $X_{32}$ may each independently be hydrogen, F, I, or $CF_3$.

In some example embodiments, the polymer may be a copolymer including: a first repeating unit represented by Formula 2-1 below; and a second repeating unit represented by Formula 2-2 below:

Formula 2-1

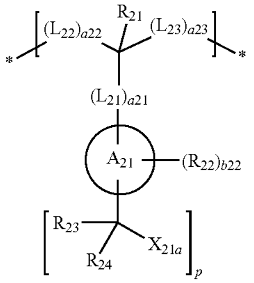

Formula 2-2

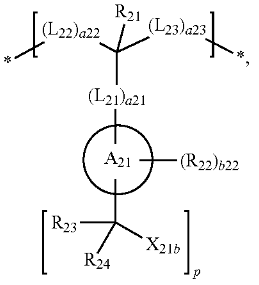

wherein, in Formulas 2-1 and 2-2, definitions of $L_{21}$ to $L_{23}$,a21 to a23, $R_{21}$ to $R_{24}$, b22, and p are the same as defined for Formula 2, $X_{21a}$ may be an ammonium salt, a phosphonium salt, a sulfonium salt, a selenium salt, or an iodonium salt, $X_{21b}$ may be a halogen, $R_{31}SO_3$, $R_{31}CO_2$, $R_{31}PO_2(OR_{32})$, or $NO_3$. $R_{31}$ and $R_{32}$ may each independently be a linear, branched, or cyclic $C_1$-$C_{30}$ monovalent hydrocarbon group optionally containing one or more heteroatoms, and * is a binding site with a neighboring atom. For example, in Formulas 2-1 and 2-2, $L_{21}$ to $L_{23}$ may each independently be a single bond, O, S, C(═O), C(═O)O, OC(═O), C(═O)NH, NHC(═O), or a linear, branched, or cyclic $C_1$-$C_{30}$ divalent hydrocarbon group optionally containing one or more heteroatoms, or any combination thereof, a21 to a23 may each independently be an integer of 1 to 4, $R_{21}$ to $R_{24}$ may each independently be hydrogen, deuterium, a halogen, or a linear, branched, or cyclic $C_1$-$C_{30}$ monovalent hydrocarbon group optionally containing one or more heteroatoms, b22 may be an integer of 1 to 10, p may be an integer of 1 to 10, $X_{21a}$ may be an ammonium salt, a phosphonium salt, a sulfonium salt, a selenium salt, or an iodonium salt, $X_{21b}$ may be a halogen, $R_{31}SO_3$, $R_{31}CO_2$, $R_{31}PO_2(OR_{32})$, or $NO_3$, $R_{31}$ and $R_{32}$ may each independently be a linear, branched, or cyclic $C_1$-$C_{30}$ monovalent hydrocarbon group optionally containing one or more heteroatoms, and * is a binding site with a neighboring atom (e.g., a neighboring atom of a neighboring repeating unit of the polymer).

In particular, the polymer may include the repeating unit represented by Formula 2-1, and the repeating unit represented by Formula 2-2 in a molar ratio of about 2:1 to about 1:5.

In some example embodiments, the polymer may include a first repeating unit represented by Formula 2-1, and not include any second repeating unit represented by Formula 2-2.

In some example embodiments, the polymer may not include any first repeating unit represented by Formula 2-1, and include a second repeating unit represented by Formula 2-2.

In some example embodiments, the repeating unit represented by Formula 1 may be selected from Group II:

Group II

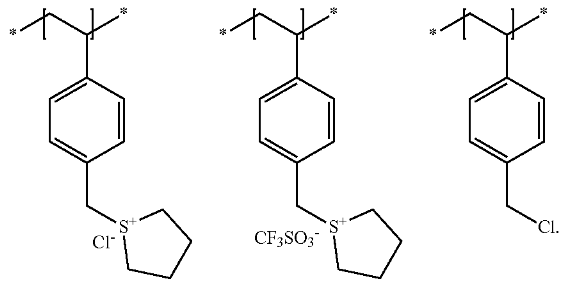

In some example embodiments, the polymer may consist of the repeating units represented by Formula 1.

In some example embodiments, the polymer may be a copolymer including the repeating unit represented by Formula 1, for example, a block copolymer, or may be a random copolymer.

Specifically, the polymer may be selected from Group II-1 below, where x, a, and b may each independently be any integer:

Group II-1

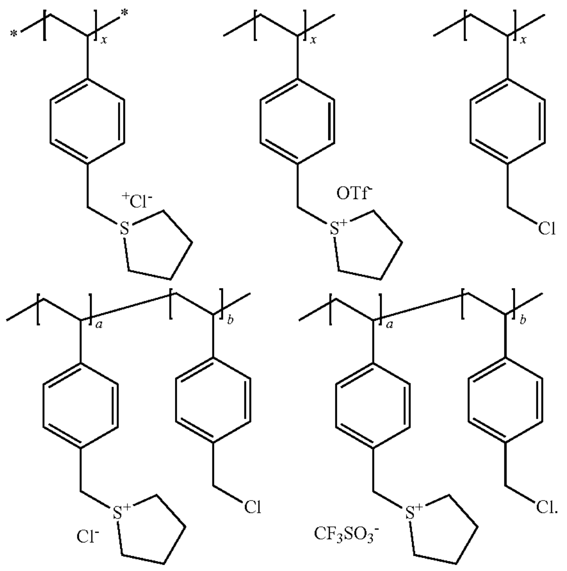

In some example embodiments, the polymer may further include a repeating unit represented by Formula 4 below:

Formula 4

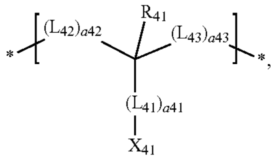

wherein, in Formula 4, $R_{41}$ may be hydrogen, deuterium, a halogen, or a linear, branched, or cyclic $C_1$-$C_{30}$ monovalent hydrocarbon group optionally containing one or more heteroatoms, $L_{41}$ to $L_{43}$ may each independently be a single bond, O, S, C(═O), C(═O)O, OC(═O), C(═O)NH, NHC(═O), or a linear, branched, or cyclic $C_1$-$C_{30}$ divalent hydrocarbon group optionally containing one or more heteroatoms, or any combination thereof, a41 to a43 may each independently be selected from an integer of 1 to 6, $X_{41}$ may be a non-acid labile group, and * is a binding site with each neighboring atom (e.g., a neighboring atom of a neighboring repeating unit of the polymer).

Specifically, for $R_{41}$ in Formula 4, refer to the description of $R_{21}$ for Formula 2.

Specifically, for $L_{41}$ to $L_{43}$ in Formula 4, refer to the description of $L_{21}$ for Formula 2.

For example, in Formula 4, $X_{41}$ may be hydrogen, or a linear, branched, or cyclic $C_1$-$C_{20}$ monovalent hydrocarbon group which contains at least one polar moiety selected from a hydroxyl group, a halogen, a cyano group, a carbonyl group, a carboxyl group, O, S, C(═O), C(═O)O, OC(═O), S(═O)O, OS(═O), a lactone ring, a sultone ring, and a carboxylic acid anhydride moiety.

Specifically, in Formula 4, $X_{41}$ may be represented by any one of Formulas 5-1 to 5-5:

5-1

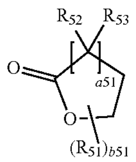

5-2

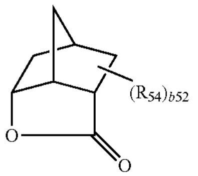

5-3

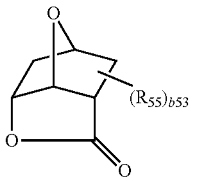

5-4

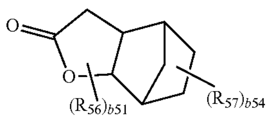

-continued 5-5

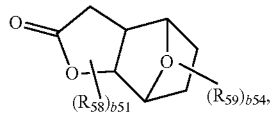

wherein, in Formulas 5-1 to 5-5, a51 may be 1 or 2, $R_{51}$ to $R_{59}$ may each independently be a bonding site with a neighboring atom, hydrogen, a hydroxyl group, a halogen, a cyano group, a $C_1$-$C_6$ alkyl group, a $C_1$-$C_6$ halogenated alkyl group, a $C_1$-$C_6$ alkoxy group, a $C_3$-$C_6$ cycloalkyl group, a $C_3$-$C_6$ cycloalkoxy group, or a $C_6$-$C_{10}$ aryl group; one of $R_{51}$ to $R_{53}$,one of $R_{54}$,one of $R_{55}$,one of $R_{56}$ and $R_{57}$,and one of $R_{58}$ and $R_{59}$ may be a binding site to a neighboring atom; b51 may be an integer of 1 to 4, b52 may be an integer of 1 to 10, and b53 and b54 may each independently be selected from an integer of 1 to 8.

In some example embodiments, the repeating unit represented by Formula 4 may be represented by any one of Formulas 4-1 and 4-2:

4-1

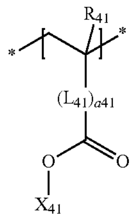

4-2

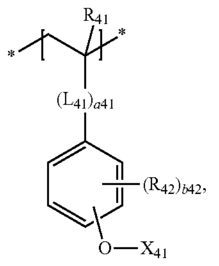

wherein, in Formulas 4-1 and 4-2, each definition of $L_{41}$ and $X_{41}$ may be the same as defined for Formula 4, a41 may be an integer of 1 to 4, $R_{42}$ may be hydrogen, or a linear, branched or cyclic $C_1$-$C_{20}$ monovalent hydrocarbon group, b42 may be an integer of 1 to 4, and * is a binding site with each neighboring atom (e.g., a neighboring atom of a neighboring repeating unit of the polymer).

In some example embodiments, the polymer may consist of repeating units represented by Formula 1 and repeating units represented by Formula 4. Specifically, the polymer may include about 1 mol % to about 90 mol % of the repeating unit represented by Formula 4 and about 10 mol % to about 99 mol % of the repeating unit represented by Formula 1. More specifically, the polymer may include about 10 mol % to about 80 mol % of the repeating unit represented by Formula 4 and about 20 mol % to about 90 mol % of the repeating unit represented by Formula 1.

Specifically, the polymer may be selected from Group II-2 below, where a and b may be any integer:

Group II-2

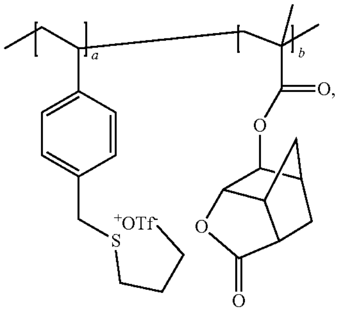

The polymer may have a weight average molecular weight (Mw) of about 1,000 to about 500,000, specifically, about 2,000 or more, about 3,000 or more, about 200,000 or less, or about 100,000 or less, as measured by gel permeation chromatography, using a tetrahydrofuran solvent, and polystyrene as a standard material.

A polydispersity index (PDI: Mw/Mn) of the polymer may be about 1.0 to about 3.0, specifically, about 1.0 to about 2.0. When the above-described range is satisfied, dispersibility and/or compatibility of the polymer may be easily controlled, and the possibility of remaining a foreign matter remaining on a pattern may be reduced, or the deterioration of the pattern profile may be reduced or minimized. Accordingly, the resist composition may be more suitable for forming fine patterns. Accordingly, a resist pattern formed based on the resist composition (e.g., based on forming, exposing, and developing a resist film as described herein) may have reduced risk of defects while having improved miniaturization, and a device (e.g., semiconductor device, electronic device, etc.) manufactured based on the resist pattern may have improved reliability due to reduced defects in the resist pattern while also having improved miniaturization, compactness, or the like.

Although not limited to a specific theory, the organometallic compound and the polymer may each form radicals by heat and/or high-energy rays. Specifically, a radical may be formed from a metal-carbon bond of the organometallic compound, and a radical may be formed in carbon at a benzyl position to which $R_{23}$ and $R_{24}$ of the polymer are bonded. These two types of radicals thus formed may form a chemical bond with each other or polymers may form a chemical bond therebetween, and due to this chemical bond, physical properties of the polymer, particularly solubility in a developing solution, may change.

The resist composition may be used as a non-chemically amplified resist composition because the physical properties of the polymer itself may be changed by the organometallic compound and/or high-energy rays.

Since the polymer has relatively high resistance to oxygen and/or moisture and may change physical properties only by high-energy rays, the resist composition with improved storage stability and the like may be provided. Accordingly, a resist pattern formed based on the resist composition (e.g., based on forming, exposing, and developing a resist film as described herein) may have reduced risk of defects while having improved miniaturization, and a device (e.g., semiconductor device, electronic device, etc.) manufactured based on the resist pattern may have improved reliability due to reduced defects in the resist pattern while also having improved miniaturization, compactness, or the like, based on using a resist composition having improved storage stability.

Since a newly formed chemical bond induces a change in the physical properties of the polymer, it is possible to provide a resist composition capable of patterning even with a low dose of high-energy rays, compared to a system in which a main chain of the polymer is decomposed to induce a change in physical properties. For example, energy expenditures associated with forming a resist pattern may be reduced due to using a low dose of high-energy rays, and thus a cost of manufacture of a resist pattern and/or a semiconductor device, electronic device, or the like based thereon may be reduced.

The polymer may be prepared by any suitable method, and for example, the polymer may be prepared by dissolving unsaturated bond-containing monomer(s) in an organic solvent, and by photopolymerizing and/or thermal polymerizing in the presence of a radical initiator.

A structure (composition) of the polymer may be confirmed by performing an FT-IR analysis, an NMR analysis, a fluorescence X-ray (XRF) analysis, mass spectrometry, UV analysis, a single crystal X-ray structure analysis, a powder X-ray diffraction (PXRD) analysis, a liquid chromatography (LC) analysis, a size exclusion chromatography (SEC) analysis, a thermal analysis, and the like. Details of the confirmation method are the same as described in the examples.

The resist composition changes solubility in a developing solution by exposure to high-energy rays. The resist composition may be a negative-type resist composition in which an unexposed portion of the resist film is dissolved and removed to form a negative-type resist pattern.

In addition, a sensitive resist composition according to some example embodiments may be for an alkali developing process using an alkali developing solution for a developing process in forming a resist pattern, or for a solvent developing process using a developing solution (hereinafter referred to as an organic developing solution) including an organic solvent for the developing process.

Since the resist composition is non-chemically amplified, the composition may not substantially contain a photoacid generator.

The resist composition may not substantially include a compound having a molecular weight of 1,000 or more in addition to the polymer, because physical properties of the polymer change upon exposure to light.

In the resist composition, the organometallic compound may be included in an amount of about 10 parts by weight to about 1,000 parts by weight, specifically, about 20 parts by weight to about 500 parts by weight, with respect to 100 parts by weight of the polymer. When the above range is satisfied, a chemical bond between the organometallic compound and the polymer is sufficiently formed to provide a resist composition with improved sensitivity and/or resolution.

Since the polymer is as described above, the organic solvent and optional components contained as necessary will be described below. In addition, in the resist composition, one type of polymer may be used, or two or more different polymers may be used in combination.

<Organic Solvent>

The resist composition may further include an organic solvent. The organic solvent included in the resist composition is not particularly limited as long as the solvent is capable of dissolving or dispersing the polymer and optional components contained as needed. One type of the organic solvent may be used, or two or more different types may be used in combination. In addition, a mixed solvent in which water and an organic solvent are mixed may be used.

Examples of the organic solvent includes, for example, an alcohol-based solvent, an ether-based solvent, a ketone-based solvent, an amide-based solvent, an ester-based solvent, a sulfoxide-based solvent, a hydrocarbon-based solvent, and the like.

More specifically, the alcohol-based solvent includes, for example, a monoalcoholic-based solvent such as methanol, ethanol, n-propanol, isopropanol, 1-methoxy-2-propanol, 1-ethoxy-2-propanol, n-butanol, isobutanol, sec-butanol, tert-butanol, n-pentanol, isopentanol, 2-methylbutanol, sec-pentanol, tert-pentanol, 3-methoxybutanol, 3-methyl-3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonylalcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol, diacetone alcohol, etc.; a polyhydric alcohol-based solvent such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol, etc.; and a polyhydric alcohol-containing ether-based solvent such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, diethylene glycol dimethyl ether, propylene glycol monomethyl ether, propylene glycol dimethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, etc.

Examples of the ether-based solvent includes a dialkyl ether-based solvent such as diethyl ether, dipropyl ether, dibutyl ether, etc.; a cyclic ether-based solvent such as tetrahydrofuran, tetrahydropyran, etc.; and an aromatic ring-containing ether-based solvent such as diphenyl ether, anisole, etc.

The ketone-based solvent may include: for example, a chain ketone-based solvent, such as acetone, methyl ethyl ketone, methyl-n-propyl ketone, methyl-n-butyl ketone, methyl-n-pentyl ketone, diethyl ketone, methyl isobutyl ketone, 2-heptanone, ethyl-n-butyl ketone, methyl-n-hexyl ketone, diisobutyl ketone, trimethyl nonanone, etc.; and a cyclic ketone-based solvent such as cyclopentanone, cyclohexanone, cycloheptanone, cyclooctanone, and methylcyclohexanone; 2,4-pentanedione, acetonylacetone, acetphenone, etc.

The amide-based solvent may include, for example, a cyclic amide-based solvent such as N,N'-dimethylimidazolidinone, and N-methyl-2-pyrrolidone; and a chain amide-based solvent such as N-methylformamide, N,N-dimethylformamide, N,N-diethylformamide, acetamide, N-methylacetamide, N,N-dimethylacetamide, and N-methylpropionamide, etc.

The ester-based solvent includes, for example, an acetate ester-based solvent such as methyl acetate, ethyl acetate, n-propyl acetate, isopropyl acetate, n-butyl acetate, isobutyl acetate, sec-butyl acetate, t-butyl acetate, n-pentyl acetate, isopentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, etc.; a polyhydric alcohol-containing ether carboxylate-based solvent such as ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropylether acetate, propylene glycol monobutylether acetate, dipropylene glycol monomethylether acetate, dipropylene glycol monoethylether acetate, etc.; a lactone-based solvent such as γ-butyrolactone, δ-valerolactone, etc.; a carbonate-based solvent such as dimethyl carbonate, diethyl carbonate, ethylene carbonate, propylene carbonate, etc.; a lactate ester-based solvent such as methyl lactate, ethyl lactate, n-butyl lactate, n-amyl lactate, etc.; glycoldiacetate, methoxytriglycol acetate, ethyl propionate, n-butyl propionate, isoamyl propionate, diethyloxalate, di-n-butyloxalate, methyl acetoacetate, ethyl acetoacetate, diethyl malonate, dimethyl phthalate, diethyl phthalate, etc.

The sulfoxide-based solvent includes, for example, dimethyl sulfoxide, diethyl sulfoxide, etc.

The hydrocarbon-based solvent includes, for example, an aliphatic hydrocarbon-based solvent such as n-pentane, isopentane, n-hexane, isohexane, n-heptane, isoheptane, 2,2,4-trimethylpentane, n-octane, isooctane, cyclohexane, methylcyclohexane, etc.; an aromatic hydrocarbon-based solvent such as benzene, toluene, xylene, mesitylene, ethylbenzene, trimethylbenzene, methylethylbenzene, n-propylbenzene, isopropylbenzene, diethylbenzene, isobutylbenzene, triethylbenzene, diisopropylbenzene, n-amylnaphthalene, etc.

Specifically, the organic solvent may be selected from an alcohol-based solvent, an amide-based solvent, an ester-based solvent, a sulfoxide-based solvent, and any combination thereof. More specifically, the solvent may be selected from propylene glycol monomethyl ether, propylene glycol monoethyl ether, propylene glycol monomethyl ether acetate, N-methyl-2-pyrrolidone, N,N-dimethylacetamide, ethyl lactate, dimethyl sulfoxide, and any combination thereof.

The organic solvent may be used in an amount of 200 parts by weight to 5,000 parts by weight, specifically, 400 parts by weight to 3,000 parts by weight, with respect to 100 parts by weight of the polymer.

<Optional Ingredients>

The resist composition may further include a surfactant, a crosslinker, a leveling agent, a colorant, or any combination thereof, as needed.

The resist composition may further include a surfactant to improve coatability, developability, etc. Specific examples of the surfactant include, for example, nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethyleneglycol dilaurate, polyethyleneglycol distearate, etc. As the surfactant, a commercially available product or a synthetic product may be used. Examples of commercially available surfactants include, for example, KP341 (manufactured by Shin-Etsu Chemical Co., Ltd.), Polyflow No. 75, Polyflow No. 95 (above, manufactured by Kyoeisha Chemical Co., Ltd.), F-top EF301, F-top EF303, F-top EF352 (above, manufactured by Mitsubishi Material Electronic Chemicals Co., Ltd.), MEGAFACE (registered trademark) F171, MEGAFACE F173, R40, R41, R43 (above, manufactured by DIC Corporation), Fluorad (registered trademark) FC430, Fluorad FC431 (above, manufactured by 3M), AsahiGuard AG710 (manufactured by AGC Corporation), Surflon (registered trademark) S-382, Surflon SC-101, Surflon SC-102, Surflon SC-103, Surflon SC-104, Surflon SC-105, Surflon SC-106 (above, manufactured by AGC Seimi Chemical Co., Ltd.), etc.

The surfactant may be included in an amount of about 0 parts by weight to about 20 parts by weight, with respect to 100 parts by weight of the polymer. One type of the surfactant may be used, or two or more different types may be used in combination.

The method of preparing the resist composition is not particularly limited, and for example, a method of mixing a polymer and optional components added as needed in an organic solvent may be used. The temperature or time during mixing is not particularly limited. Filtration may be performed after mixing, as needed.

Resist Composition-Monomer Included

A resist composition according to some example embodiments may include an organometallic compound represented by Formula 1; and a monomer represented by Formula 20 below:

Formula 1

$$M_{11}(R_{11})_n(OR_{12})_{(4-n)},$$

Formula 20

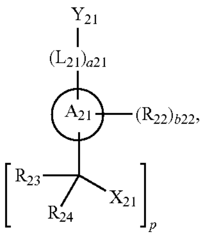

Wherein, in Formulas 1 and 20, $M_{11}$ may be indium (In), tin (Sn), antimony (Sb), tellurium (Te), thallium (Tl), lead (Pb), bismuth (Bi), silver (Ag), or polonium (Po), $R_{11}$ may be a linear, branched, or cyclic $C_1$-$C_{30}$ monovalent hydrocarbon group optionally containing heteroatoms, $R_{12}$ may be a linear, branched, or cyclic $C_1$-$C_{30}$ monovalent hydrocarbon group optionally containing heteroatoms, or may be $*$-$M_{12}(R_{13})_m(OR_{14})_{(3-m)}$, n may be an integer of 1 to 4, $M_{12}$ may be indium (In), tin (Sn), antimony (Sb), tellurium (Te), thallium (Tl), lead (Pb), bismuth (Bi), silver (Ag), or polonium (Po), $R_{13}$ and $R_{14}$ may each independently be a linear, branched, or cyclic $C_1$-$C_{30}$ monovalent hydrocarbon group optionally containing one or more heteroatoms, m may be an integer of 0 to 3, $Y_{21}$ may be a polymerizable group, $L_{21}$ may be a single bond, O, S, C═O, C(═O)O, OC(═O), C(═O)NH, NHC(═O), or a linear, branched, or cyclic $C_1$-$C_{30}$ divalent hydrocarbon group optionally containing one or more heteroatoms, or any combination thereof, a21 may be an integer of 1 to 4, $A_{21}$ may be a $C_1$-$C_{30}$ aryl group or a $C_1$-$C_{30}$ heteroaryl group, $R_{21}$ to $R_{24}$ may each independently be hydrogen, deuterium, a halogen, or a linear, branched, or cyclic $C_1$-$C_{30}$ monovalent hydrocarbon group optionally containing one or more heteroatoms, b22 may be an integer of 1 to 10, $X_{21}$ may be a leaving group, and * is a binding site with a neighboring atom. In Formula 20, * is a binding site with a neighboring atom of an adjacent repeating unit of the polymer. A quantity of repeating units in the polymer may be any integer, for example any quantity equal to or greater than 2. In some example embodiments of Formula 1 where $R_{12}$ is $*$-$M_{12}(R_{13})_m(OR_{14})_{(3-m)}$, * of $*$-$M_{12}(R_{13})_m(OR_{14})_{(3-m)}$ is a binding site with a neighboring atom of Formula 1. In some example embodiments, Formula 20 may be referred to herein interchangeably as Formula 2, Formula 6, or the like.

For example, in Formula 20, $Y_{21}$ may include a vinyl group, an acrylate group, a methacrylate group, an oxirane group, an epoxy group, an oxetane group, a thiol group, or any combination thereof, as a partial structure.

Specifically, in Formula 20, $Y_{21}$ may include a vinyl group, an acrylate group, a methacrylate group, or any combination thereof, as a partial structure.

In some example embodiments, the monomer represented by Formula 20 may be selected from Group III below:

Group III

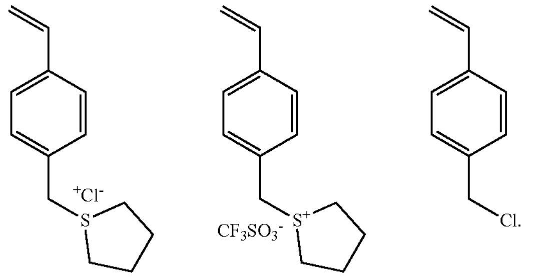

The resist composition including the monomer is the same as the resist composition including the above-described polymer except that the monomer is included instead of the polymer. For a description of the resist composition including the monomer, refer to a description of the resist composition including the polymer.

Pattern Formation Method

Figure 2A:
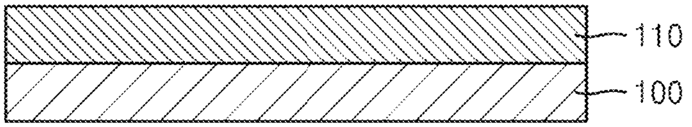
FIGS. 2A, 2B, and 2C are side cross-sectional views showing a method of forming a pattern according to some example embodiments.
Figure 2B:
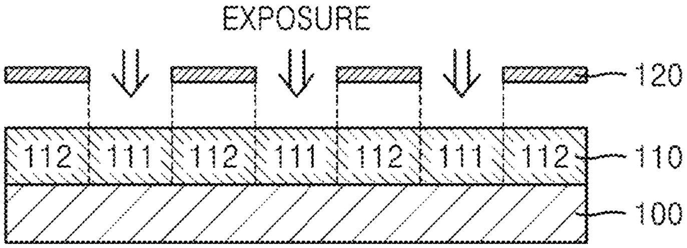
Figure 2C:
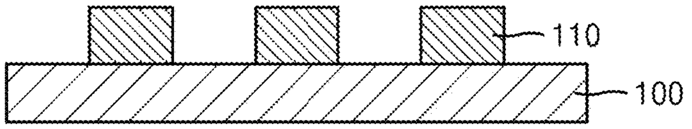

Hereinafter, a method of forming a pattern according to some example embodiments will be described in more detail with reference to FIGS. 1 and 2A to 2C. FIG. 1 is a flow chart illustrating a method, including a method of forming a pattern, according to some example embodiments, and FIGS. 2A to 2C are side cross-sectional views illustrating the pattern formation method according to some example embodiments. Hereinafter, a method of forming a pattern using a negative resist composition will be specifically described as an example, but the method is not limited thereto.

Referring to FIG. 1, a method may include the pattern formation method that may include: forming a resist film by (e.g., based on) applying a resist composition (S101); exposing at least a portion of the resist film with high-energy rays (S102); and developing the exposed resist film by (e.g., based on) using a developing solution (S103). In some example embodiments, the method may further include manufacturing an electronic device based on the developed exposed resist film. The above processes may be omitted when necessary, or may be performed in different order.

First, referring to FIG. 1 and FIG. 2A, a substrate 100 is prepared. For the substrate 100, for example, a semiconductor substrate such as a silicon substrate or a germanium substrate, glass, quartz, ceramic, copper, etc. may be used. In some example embodiments, the substrate 100 may include a III-V compound such as GaP, GaAs, GaSb, etc.

The resist film 110 may be formed by (e.g., based on) applying a resist composition to a desired thickness on the substrate 100 specifically by a coating method. As needed, heating (referred to as pre-bake (PB) or post-anneal bake (PAB)) may be performed to remove an organic solvent remaining in the resist film 110. In some example embodiments, radicals may be generated by heating the resist film 110, and then crosslinks may be formed by chemical bonding of the radicals by an exposure to light. The resist film 110 may include the resist composition according to any of the example embodiments.

As the coating method, spin coating, dipping, roller coating, or other general coating methods may be used. Among these, spin coating may be particularly used, and the resist film 110 having a desired thickness may be formed by adjusting viscosity, concentration, and/or spin speed of the resist composition. Specifically, the resist film 110 may have a thickness of about 10 nm to about 300 nm. More specifically, the resist film 110 may have a thickness of about 15 nm to about 200 nm.

A lower limit of a temperature of a post annealing bake may be 60° C. or higher, specifically, 80° C. or higher. In addition, an upper limit of the temperature of the post annealing bake may be 200° C. or less, specifically, 180° C. or less. A lower limit of time of the post annealing bake may be 5 seconds or more, specifically, 10 seconds or more. An upper limit of time of the post annealing bake may be 600 seconds or less, specifically, 300 seconds or less.

Prior to applying the resist composition on the substrate 100, an etching target film (not shown) may be further formed on the substrate 100. The etching target film may refer to a layer on which an image is transferred from a resist pattern and converted into a particular (or, alternatively, predetermined) pattern. In some example embodiments, the etching target film may be formed to include an insulating material such as silicon oxide, silicon nitride, or silicon oxynitride. In some example embodiments, the etching target film may be formed to include a conductive material such as a metal, a metal nitride, a metal silicide, or a metal silicide nitride film. In some example embodiments, the etching target film may be formed to include a semiconductor material such as polysilicon.

In some example embodiments, an anti-reflection film may be further formed on the substrate 100 to increase or maximize efficiency of the resist. The anti-reflection film may be an organic or inorganic anti-reflection film.

In some example embodiments, a protective film may be further provided on the resist film 110 to reduce effects of alkaline impurities or the like included in the process. In addition, when immersion exposure is performed, for example, a protective film for immersion may be provided on the resist film 110 to avoid direct contact between the immersion medium and the resist film 110.

Next, referring to FIG. 1 and FIG. 2B, at least a portion of the resist film 110 may be exposed to high-energy rays, thereby establishing an exposed resist film. For example, high-energy rays passing through a mask 120 may be irradiated to at least a portion of the resist film 110. For this reason, based on the exposing, the resist film 110 (e.g., the exposed resist film) may have an exposed portion 111 and a non-exposed portion 112.

Although not limited to a specific theory, radicals may be generated in the exposed portion 111 by exposure, and chemical bonds may be formed between the radicals, so that physical properties of the resist composition may be changed.

In some cases, this exposure is performed by (e.g., based on) irradiating high-energy rays through a mask 120 having a particular (or, alternatively, predetermined) pattern using a liquid such as water as a medium. Examples of the high-energy rays include electromagnetic waves such as ultraviolet rays, far-ultraviolet rays, extra-ultraviolet rays (EUV, wavelength 13.5 nm), X-rays, and γ-rays; charged corpuscular beams, such as electron beams (Ebs), alpha rays, etc. Irradiation of these high-energy rays may be collectively referred to as "exposure".

As a light source for the exposure, various devices such as a device emitting laser light in the ultraviolet region such as a KrF excimer laser (wavelength 248 nm), an ArF excimer laser (wavelength 193 nm), and $F_2$ excimer laser (wavelength 157 nm); a device that converts wavelengths of laser light from a solid-state laser light source (YAG or semiconductor laser, etc.) to emit harmonic laser light in the far-ultraviolet region or vacuum ultraviolet region; or a device that irradiates electron beams or extreme ultraviolet (EUV) rays may be used. Exposure is usually performed through a mask corresponding to a desired pattern, but when the exposure light source is an electron beam, exposure may be performed by direct drawing without using a mask.

An integrated dose of high-energy rays, for example, when extreme ultraviolet rays are used as the high-energy rays, may be about 2,000 $mJ/cm^2$ or less, specifically about 500 $mJ/cm^2$ or less. In addition, when an electron beam is used as the high-energy ray, an integrated dose may be about 5,000 $\mu C/cm^2$ or less, specifically, 1,000 $\mu C/cm^2$ or less.

In addition, post exposure bake (PEB) may be performed after an exposure. A lower limit of a temperature of the PEB may be about 50° C.or higher, specifically about 80° C. or higher. An upper limit of a temperature of the PEB may be about 250° C.or lower, specifically about 200° C. or lower. A lower limit of time of performing the PEB may be about 5 seconds or more, specifically, about 10 seconds or more. An upper limit of time of performing the PEB may be about 600 seconds or less, specifically, about 300 seconds or less.

Next, referring to FIG. 1 and FIG. 2C, the exposed resist film 110 may be developed by using a developing solution. The non-exposed portion 112 (also referred to herein as an unexposed portion) may be washed away (e.g., removed from the exposed resist film 110) by the developing solution, and the exposed portion 111 remains unwashed away by the developing solution. The resultant structure as shown in FIG. 2C may be a resist pattern.

Examples of the developing solution include an alkaline developing solution, a developing solution containing an organic solvent (hereinafter, also referred to as "organic developing solution"), etc. Examples of the developing method include the dipping method, the puddle method, the spray method, the dynamic dosing method, etc. A developing temperature may be, for example, about 5° C.or more to about 60° C.or less, and the developing time may be, for example, about 5 seconds or more to about 300 seconds or less.

The alkaline developing solutions include, for example, alkaline aqueous solutions in which at least one type of alkaline compounds is dissolved, the alkaline compounds including: sodium hydroxide, potassium hydroxide, sodium carbonate, sodium silicate, sodium metasilicate, ammonia water, ethylamine, n-propylamine, diethylamine, di-n-propylamine, triethylamine, methyldiethyl amine, ethyldimethylamine, triethanolamine, tetramethyl ammonium hydroxide (TMAH), pyrrole, piperidine, choline, 1,8-diazabicyclo [5.4.0]-7-undecene (DBU), 1,5-diazabicyclo[4.3.0]-5-nonene (DBN), etc. The alkaline developing solution may further include a surfactant.

A lower limit of a content of the alkaline compounds in the alkaline developing solution may be about 0.1 wt % or more, specifically about 0.5 wt % or more, more specifically, about 1 wt % or more. In addition, an upper limit of a content of the alkaline compounds in the alkaline developing solution may be about 20 wt % or less, specifically about 10 wt % or less, more specifically, about 5 wt % or less.

As an organic solvent contained in the organic developing solution, for example, the same organic solvents as exemplified in the <Organic solvent> part of [Resist composition] may be used. Specifically, as the organic developing solution, n-butyl acetate (nBA), propylene glycol methyl ether (PGME), propylene glycol methyl ether acetate (PGMEA), γ-butyrolactone (GBL), isopropanol (IPA), and the like may be used.

A lower limit of a content of the organic solvent in the organic developing solution may be about 80 wt % or more, specifically about 90 wt % or more, more specifically about 95 wt % or more, particularly about 99 wt % or more.

The organic developing solution may further include a surfactant. In addition, a trace amount of water may be included in the organic developing solution. In addition, during development, development may also be stopped by substituting the organic developing solution with a solvent of a different kind.

A resist pattern after development may be further cleaned. Ultrapure water, rinse solution, etc. may be used as a cleaning liquid. The rinsing solution is not particularly limited as long as it does not dissolve the resist pattern, and a solution including a general organic solvent may be used. For example, the rinsing solution may be an alcohol-based solvent or an ester-based solvent. After cleaning, the rinsing solution remaining on the substrate and pattern may be removed. In addition, when ultrapure water is used, water remaining on the substrate and the pattern may be removed.

In addition, one type of a developing solution may be used alone, or two or more types of developing solutions may be used in combination.

After the resist pattern is formed as described above, a pattern wiring substrate may be obtained by an etching method. The etching method may be performed by known methods such as dry etching using a plasma gas and wet etching using an alkaline solution, cupric chloride solution, ferric chloride solution, or the like.

After forming the resist pattern, plating may be performed. The plating method is not particularly limited, and examples thereof include copper plating, solder plating, nickel plating, and gold plating.

The resist pattern remaining after etching may be released with an organic solvent. Examples of such an organic solvent include, but are not particularly limited to, propylene glycol monomethyl ether acetate (PGMEA), propylene glycol monomethyl ether (PGME), ethyl lactate (EL), and the like. The stripping method is not particularly limited, but includes, for example, the immersion method, the spray method, etc. Further, the wiring substrate on which the resist pattern is formed may be a multilayer wiring substrate or may have small-diameter through-holes.

In some example embodiments, the wiring substrate (also referred to herein as a wiring board, for example a printed circuit board) may be formed by a method of depositing a metal in a vacuum after forming a resist pattern and then melting the resist pattern into a solution, that is, the lift-off method.

In some example embodiments, a method may include incorporating the resist pattern and/or a structure based thereon (e.g., a pattern wiring substrate) into a manufactured electronic device. The electronic device may include, for example, one or more instances of processing circuitry such as hardware including logic circuits; a hardware/software combination such as a processor executing software; or any combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a DRAM device, storing a program of instructions, and a processor (e.g., CPU) configured to execute the program of instructions to implement the functionality of the manufactured electronic device and/or any portions thereof.

The electronic device may include one or more devices, structures, or the like (e.g., one or more semiconductor devices in one or more processors, memories, processing circuitry, etc.) which may include the resist pattern and/or a structure based thereon (e.g., a pattern wiring substrate). As a result, the electronic device may have improved performance, compactness, or the like based on including one or more devices, structures, or the like that are based on (e.g., include, incorporate, or the like) the resist pattern and/or a structure based thereon (e.g., a pattern wiring substrate), which is formed using a resist composition with improved sensitivity, resolution, storage stability, and the like as described herein, such that one or more patterns of the resist pattern and/or a structure based thereon (e.g., a pattern wiring substrate) may have improved resolution, compactness (e.g., miniaturization), or the like. Accordingly, the electronic device and/or one or more devices thereof that are based on the resist pattern may have improved miniaturization due to including fine patterns while also having improved reliability due to reduced risk of having process defects due to improved uniformity of patterns thereof, reduced surface roughness thereof, reduction or prevention of acid diffusion, and/or with reduced or minimized exposure to high doses of light to complete manufacture thereof. As a further result, the yield of manufacture of defect-free electronic devices may thus be improved, and/or costs of manufacture thereof may be reduced, based on the method according to some example embodiments.

The inventive concepts will be described in more detail using the following examples and comparative examples, but the technical scope of the inventive concepts is not limited only to the following examples.

EXAMPLES

Synthesis Example 1: Synthesis of P(VBS.Cl)

(1) Synthesis of VBS.Cl

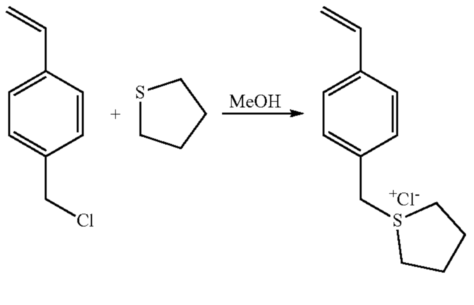

Figure 3A:
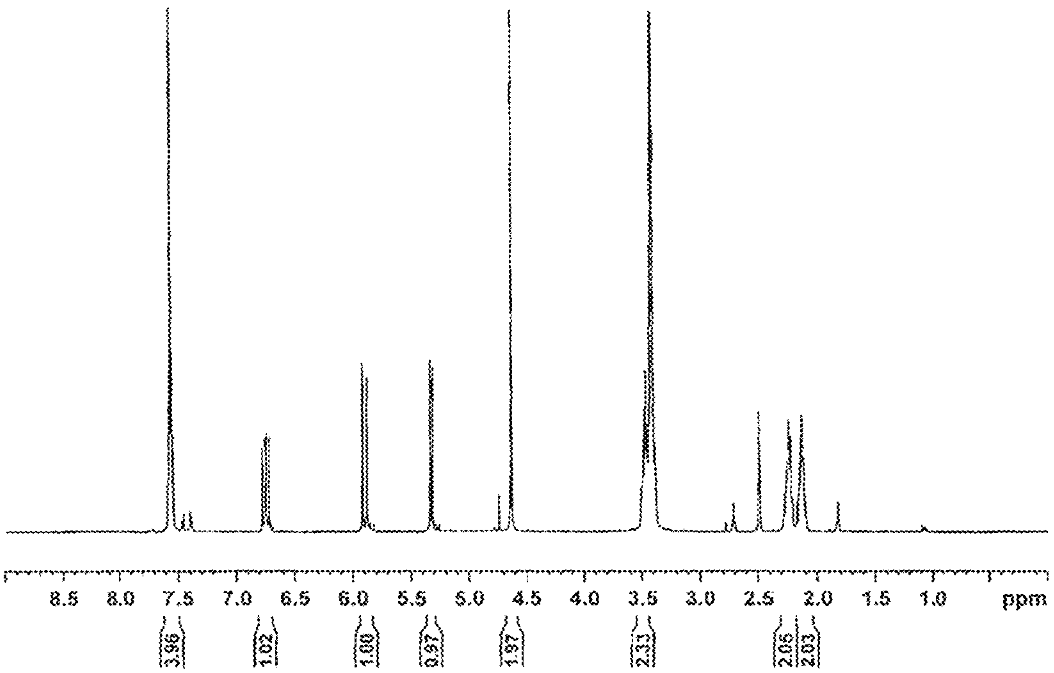
FIG. 3A is a $^1$H-NMR spectrum of VBS.Cl.

Vinylbenzyl chloride (VBC) (10 g, 65.5 mmol) and tetrahydrothiophene (8.7 g, 98.3 mmol) were placed in a round bottom flask and dissolved in 200 ml of methanol. After allowing a reactions at 50° C. for 24 hours, the resultant was precipitated by using diethyl ether. After drying the precipitate at room temperature for 24 hours, VBS.Cl monomers were obtained. Results of analyzing the obtained VBS.Cl by $^1$H-NMR is shown in FIG. 3A.

(2) Synthesis of P(VBS.Cl)

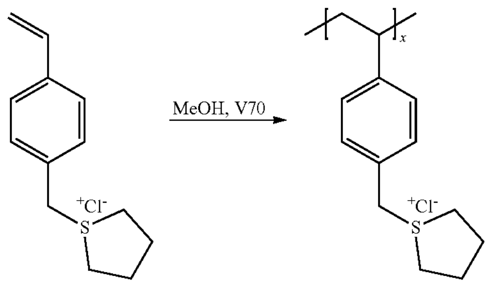

Figure 3B:
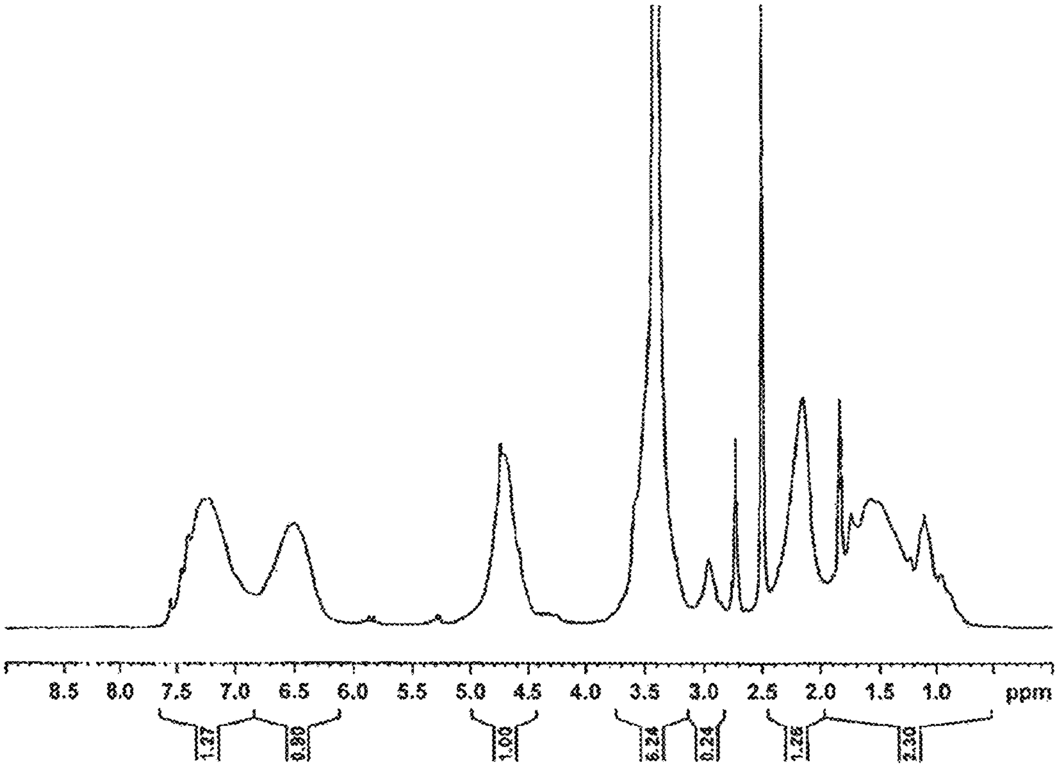
FIG. 3B is a $^1$H-NMR spectrum of P(VBS.Cl)

VBS.Cl (1 g, 4.2 mmol) and V70 (0.13 g, 0.4 mmol) were put into a vial and dissolved in 5 mL of methanol. After allowing a reaction at 40° C. for 24 hours, and a PVBS.Cl polymer was synthesized by precipitation by using diethylether. Results of analyzing the obtained P(VBS.Cl) by $^1$H-NMR is shown in FIG. 3B.

Synthesis Example 2: Synthesis of P(VBS.Otf)

(1) Synthesis of VBS.Otf

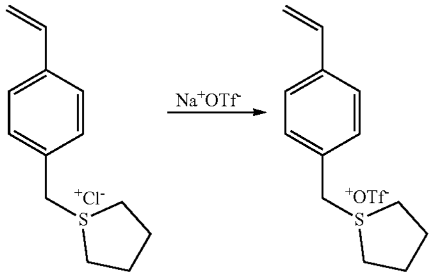

Figure 4A:
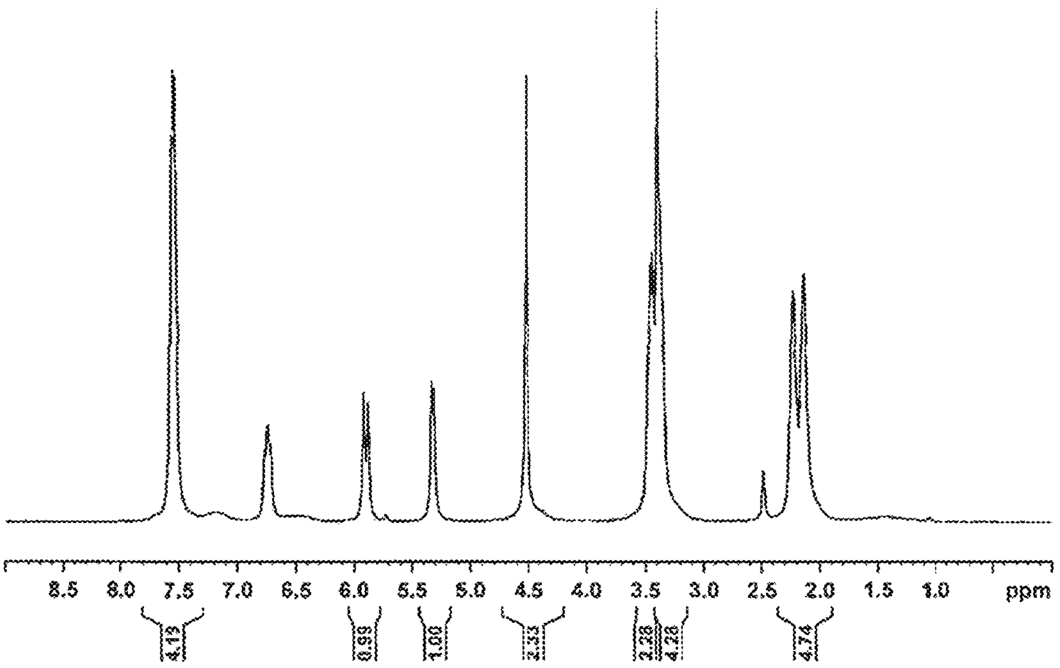
FIG. 4A is a $^1$H-NMR spectrum of VBS.Otf.

VBS.Cl (5 g, 20.8 mmol) and sodium trifluoromethanesulfonate (7.2 g, 41.5 mmol) obtained in the synthesis of VBS.Cl in Synthesis Example 1 were dissolved in water, and then were reacted at room temperature for 4 hours. After completion of the reaction, the obtained precipitate was washed with diethylether to obtain VBS.Otf monomers. Results of analyzing the obtained VBS.Otf by $^1$H-NMR is shown in FIG. 4A.

(2) Synthesis of P(VBSOTfl)

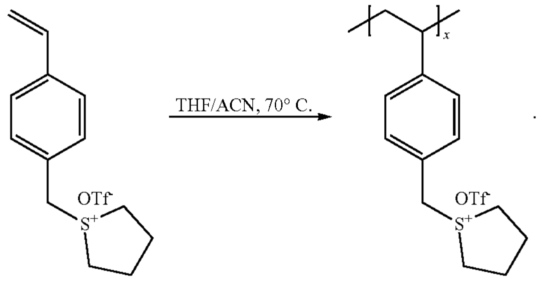

Figure 4B:
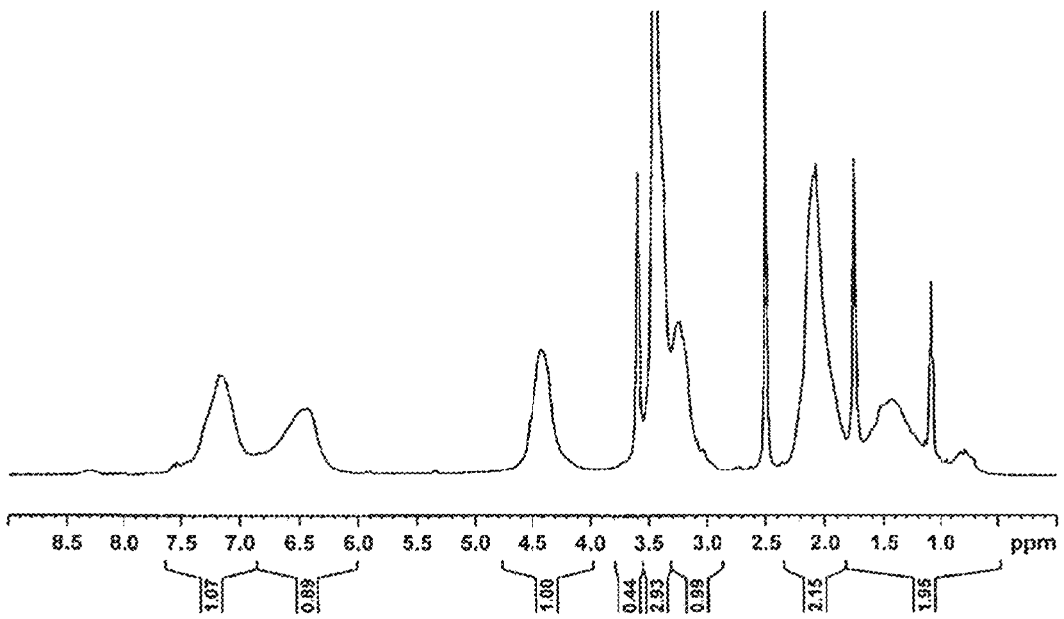
FIG. 4B is a $^1$H-NMR spectrum of P(VBS.Otf)

VBS.Otf (2 g, 5.6 mmol) and V601 (0.065 g, 0.3 mmol) were put into a vial and dissolved in 10 mL of tetrahydrofuran (THF)/acetonitrile (ACN) (50/50, v/v). A reactions was carried out at 70° C. for 24 hours and the resultant was precipitated by using diethyl ether to synthesize P (VBS.Otf) polymer. Results of analyzing the obtained P(VBS.Otf) by $^1$H-NMR is shown in FIG. 4B.

Synthesis Example 3: Synthesis of P(VBC)

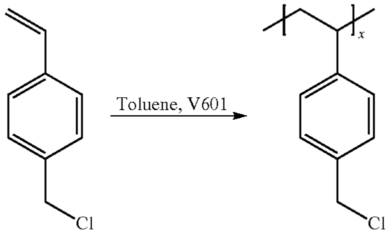

Figure 5:
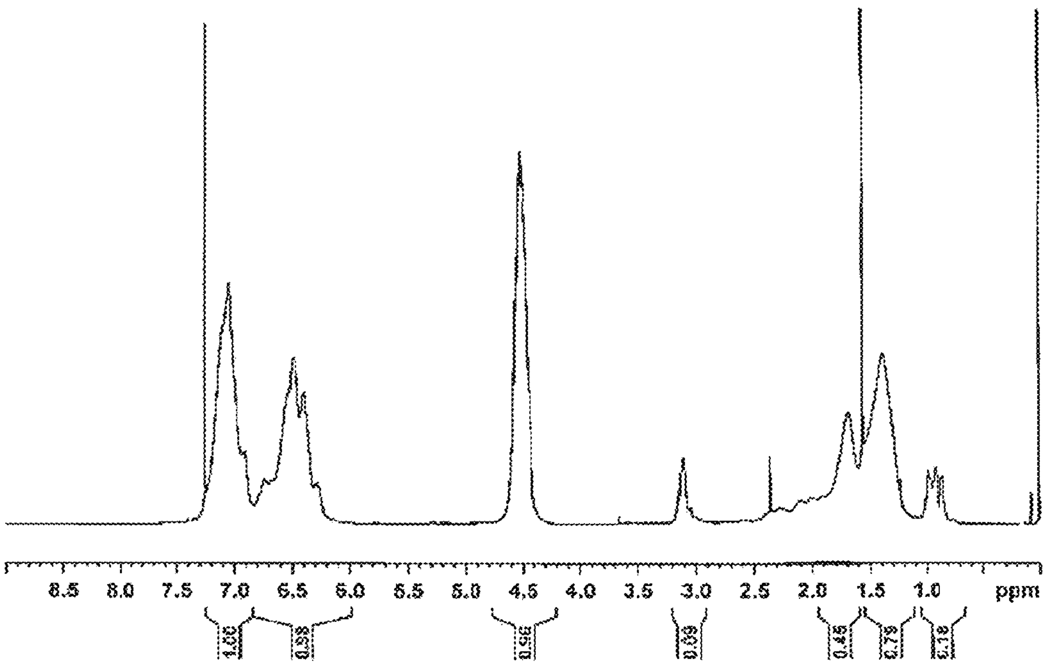
FIG. 5 is a $^1$H-NMR spectrum of P(VBC)

Vinylbenzyl chloride (2 g, 13.1 mmol) and V601 (0.15 g, 0.7 mmol) were put into a vial and dissolved in 10 mL of toluene. A reactions was carried out at 70° C. for 24 hours, and the resultant was precipitated by using MeOH to synthesize a P (VBC) polymer. Results of analyzing the obtained P(VBS) by $^1$H-NMR is shown in FIG. 5.

Synthesis Example 4: Synthesis of P(VBS.Cl/VBC)

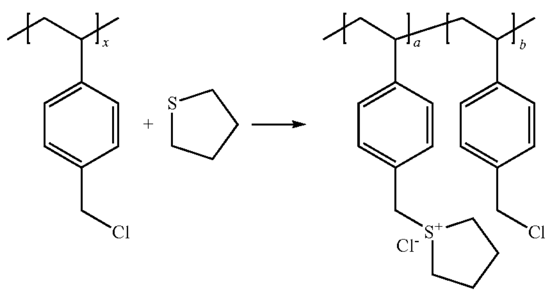

Figure 6:
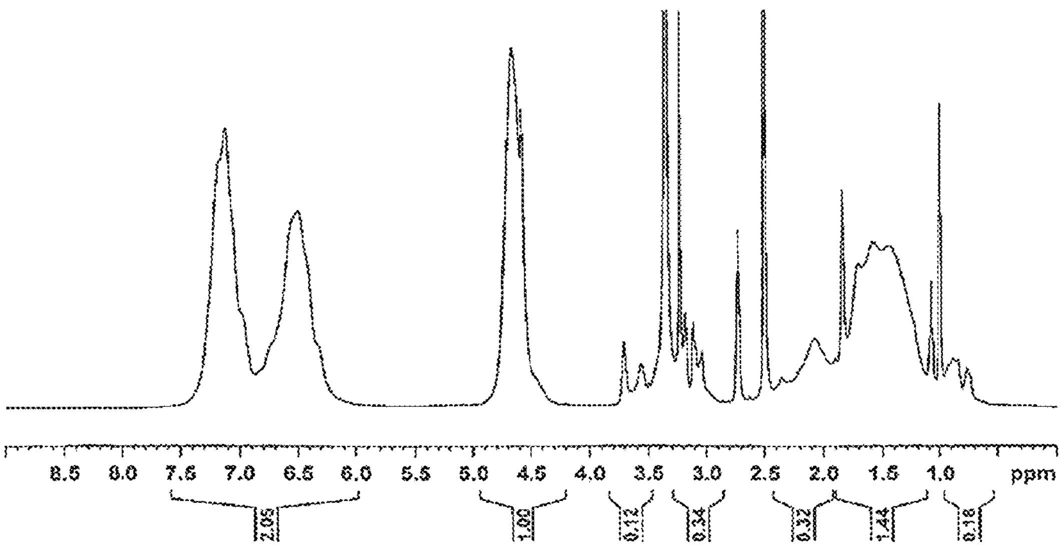
FIG. 6 is a $^1$H-NMR spectrum of P(VBS.Cl/VBC)(=16/84)

1 g of P(VBC) and 1 g of tetrahydrothiophene were dissolved in propylene glycol methyl ether (PGME) and reacted at 50° C. for 24 hours. The resultant was precipitated by using diethylether and dried to synthesize a P(VBS.Cl/VBC) polymer in which 16 mol % was substituted with sulfonium. Results of the obtained analyzing P(VBS.Cl/VBC)(=16/84) by $^{1}$H-NMR is shown in FIG. 6.

Synthesis Example 5: Synthesis of SP205

Initiator V601 (Wako chemical, 0.426 g, 1.84 mmol), 1.5 g (9.3 mmol) of acetoxystyrene (AHS), 0.2 g (0.9 mmol) of azo initiator (V601) were added to a 100 ml reactor and dissolved in 3 mL of 1,4-dioxane. While stirring the solution at room temperature, nitrogen bubbling was performed for about 20 minutes. After the bubbling was completed and the reactor was closed again, polymerization was carried out at 80° C. for 4 hours. After the reaction was completed, the polymer was precipitated in 200 ml of hexan. A precipitate was obtained by using a glass filter and dried overnight at 40° C. in a vacuum drying oven. 1 g (yield: 70%) of polymer SP205 having a weight average molecular weight of 4,625 g/mol and a polydispersity index (PDI) of 2.2 was obtained.

SP205

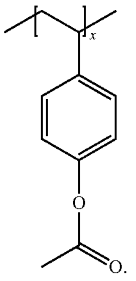

Synthesis Example 6: Synthesis of Compound T1

(1) Synthesis of di(4-fluorobenzyl) Tin Dichloride (FB)

Di(4-Fluorobenzyl) Tin Dichloride (FB)

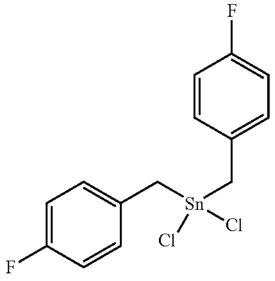 [SMILES: Fc1ccc([CH2][Sn]([Cl])([Cl])[CH2]c2ccc(F)cc2)cc1]

Figure 7A:
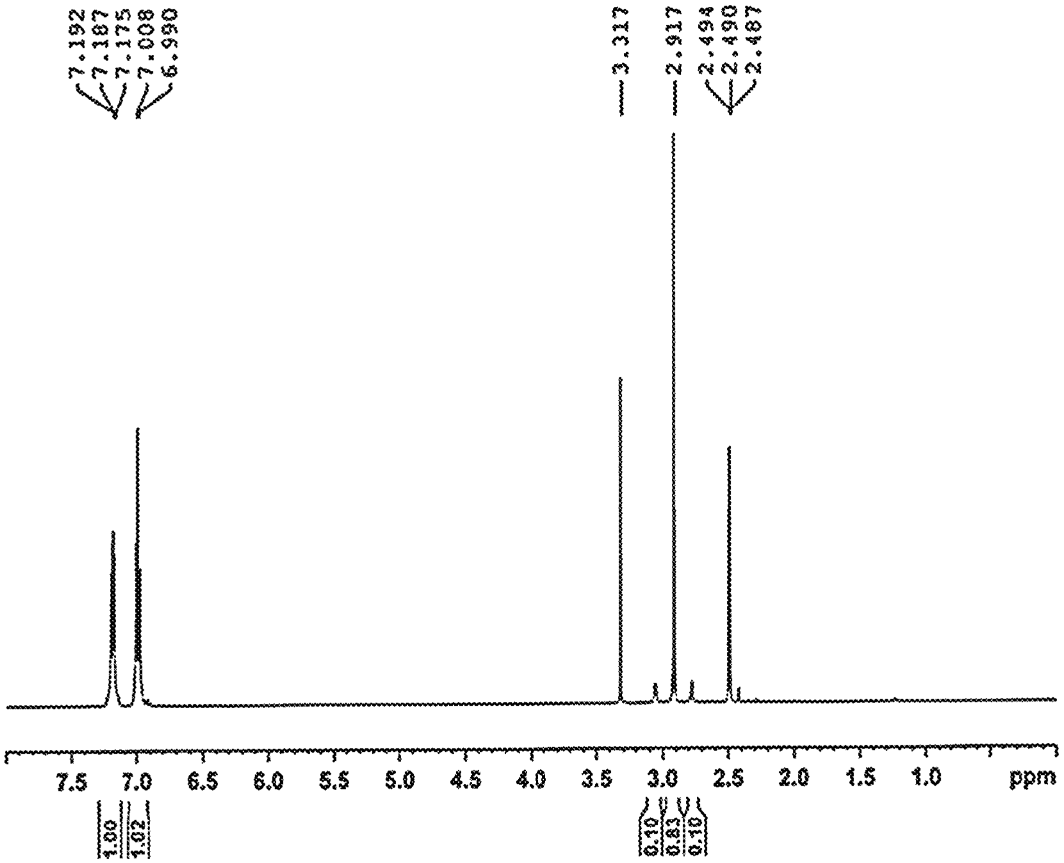
FIGS. 7A, 7B, 7C, and 7D are $^1$H-NMR and $^{119}$Sn-NMR spectra of compounds FB and T1.
Figure 7B:
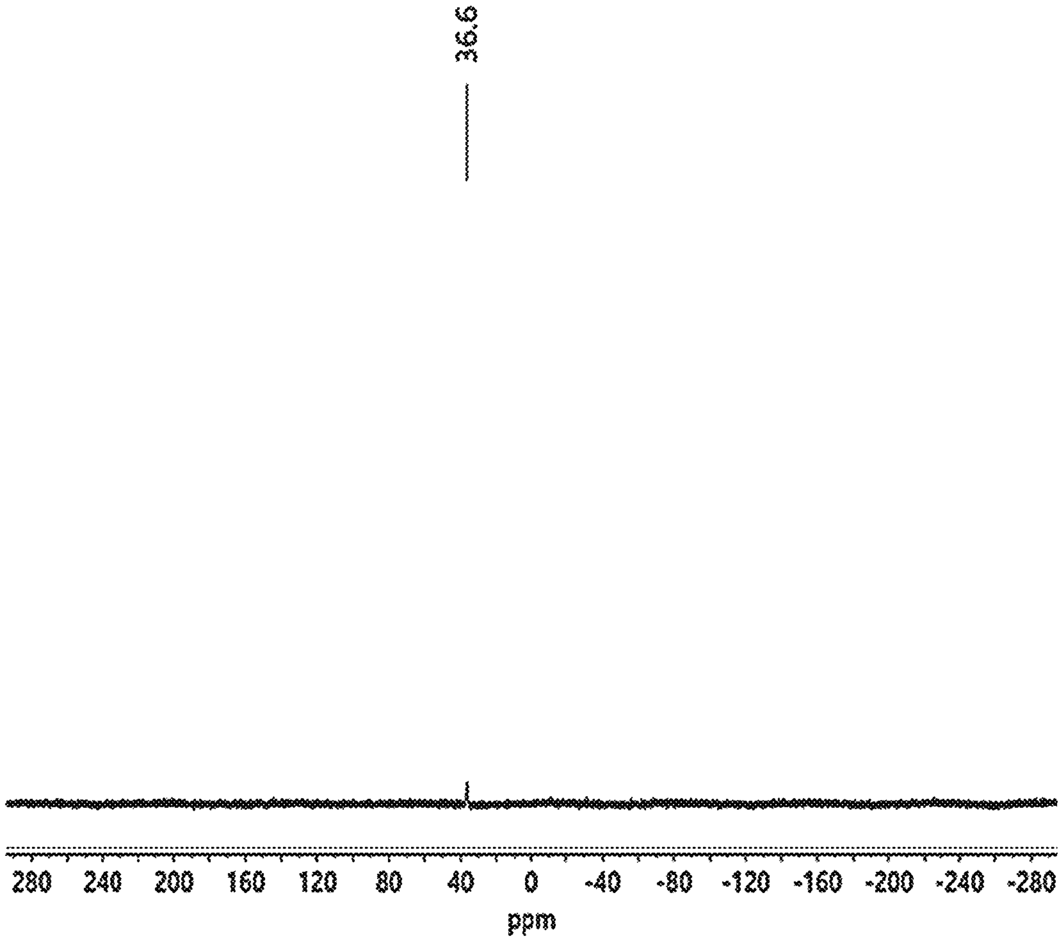

Tin powder (8.2 g, 69 mmol) and 120 ml of dry toluene were placed in a 250 ml reaction flask and heated to 90° C. Then, 0.82 g of pure water was added as a catalyst, and 4-fluorobenzyl chloride (10 g, 69 mmol) was added dropwise over 10 minutes. The reaction temperature was raised to 130° C. and then the sample was heated under reflux for 4 hours. After completion of the reaction, unreacted powder was removed with a filter and cooled to obtain white crystals. The obtained white crystals were washed with cold toluene and then dried overnight at 40° C. to obtain 10.92 g of a compound FB (yield: 60%). The obtained compound FB was analyzed by $^{1}$H-NMR and $^{119}$Sn-NMR and the results are shown in FIGS. 7A and 7B, respectively.

(2) Synthesis of di(4-fluorobenzyl) Tin Dicarboxylate (T1)

<Di(4-fluorobenzyl) Tin Dicarboxylate (Acetate) (T1)

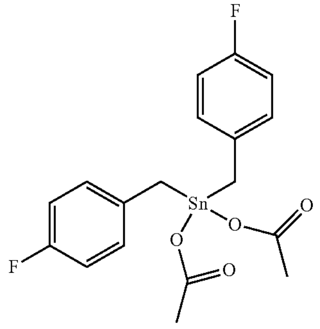 [SMILES: CC(=O)[O][Sn]([CH2]c1ccc(F)cc1)([CH2]c1ccc(F)cc1)[O]C(C)=O]

Figure 7C:
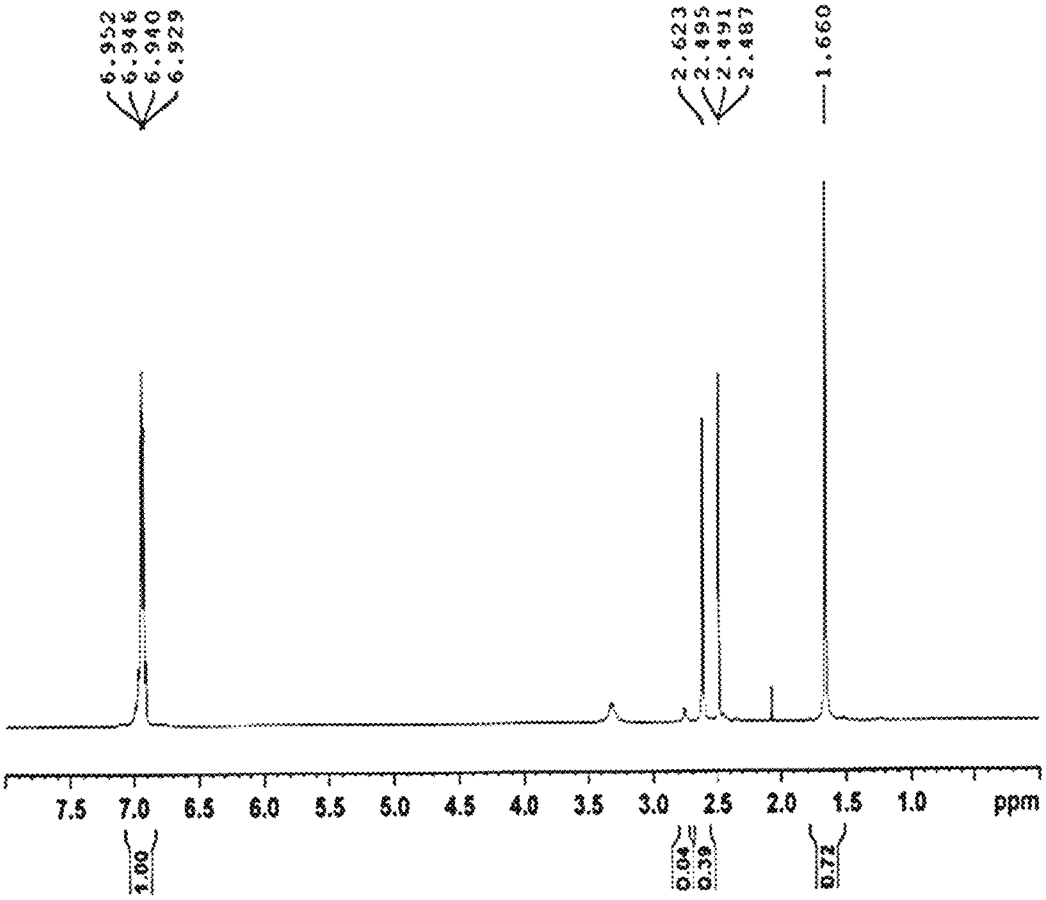
Figure 7D:
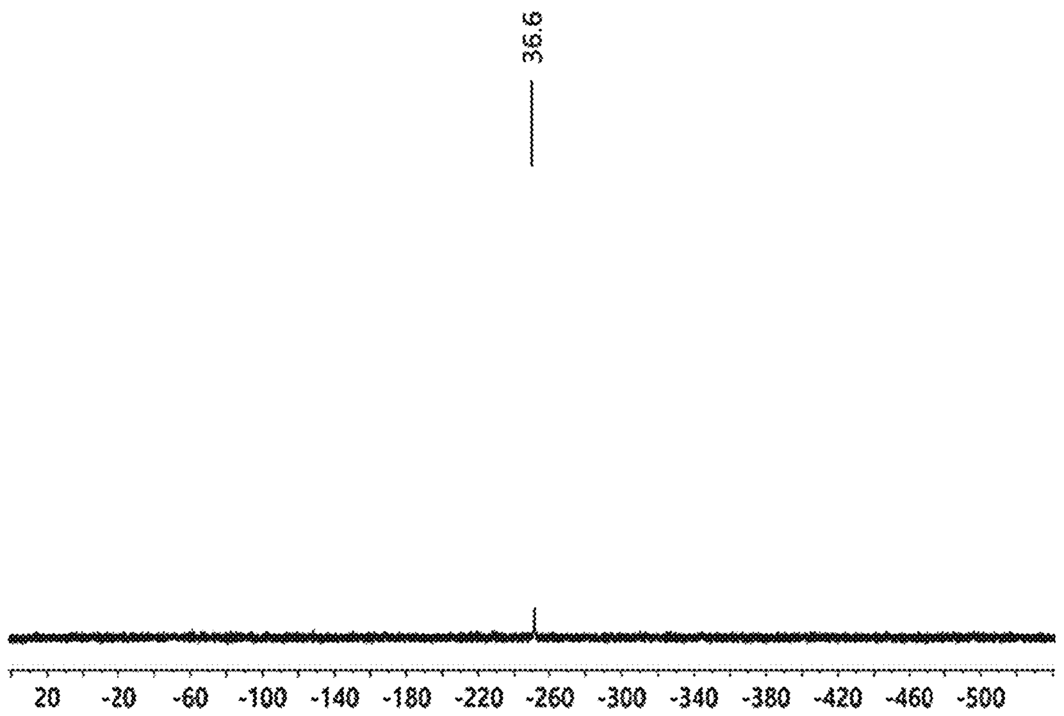
Figure 8A:
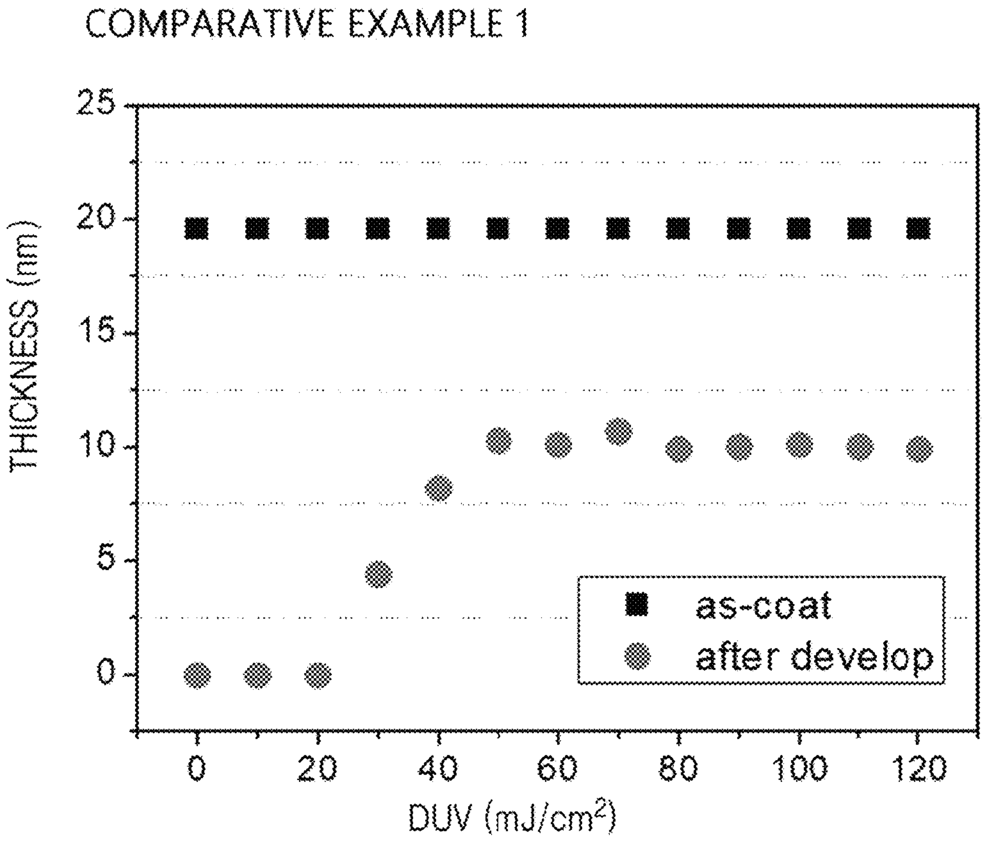
FIGS. 8A, 8B, 8C, 8D, 8E, and 8F are diagrams showing changes in film thicknesses after development according to doses of Comparative Example 1, Comparative Example 2, and Examples 1 to 4, respectively.
Figure 8B:
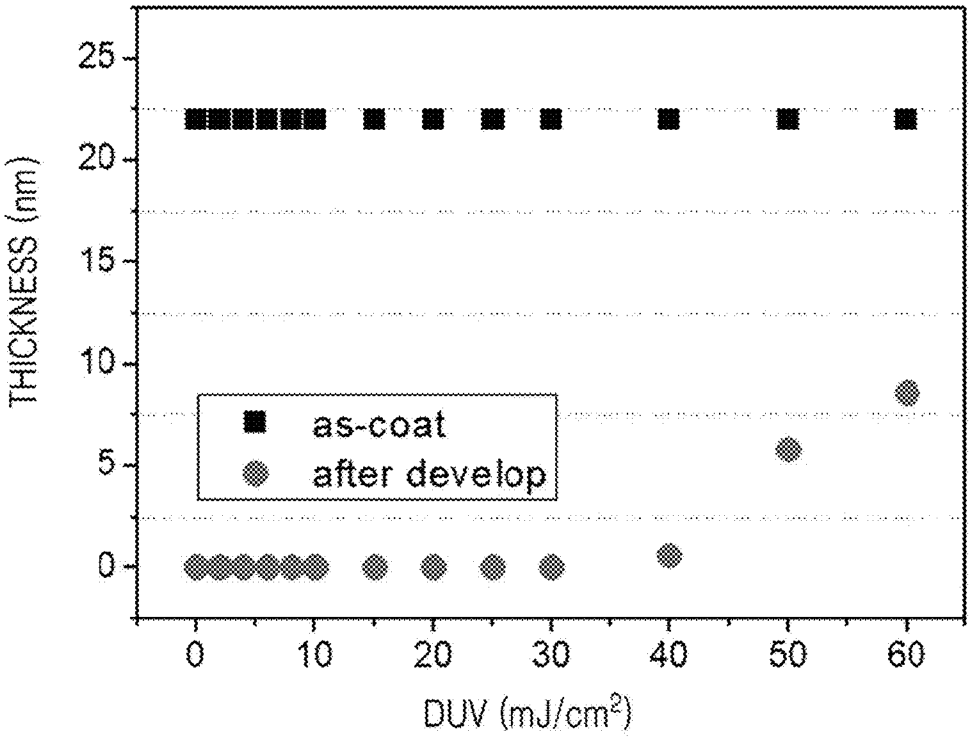
Figure 8C:
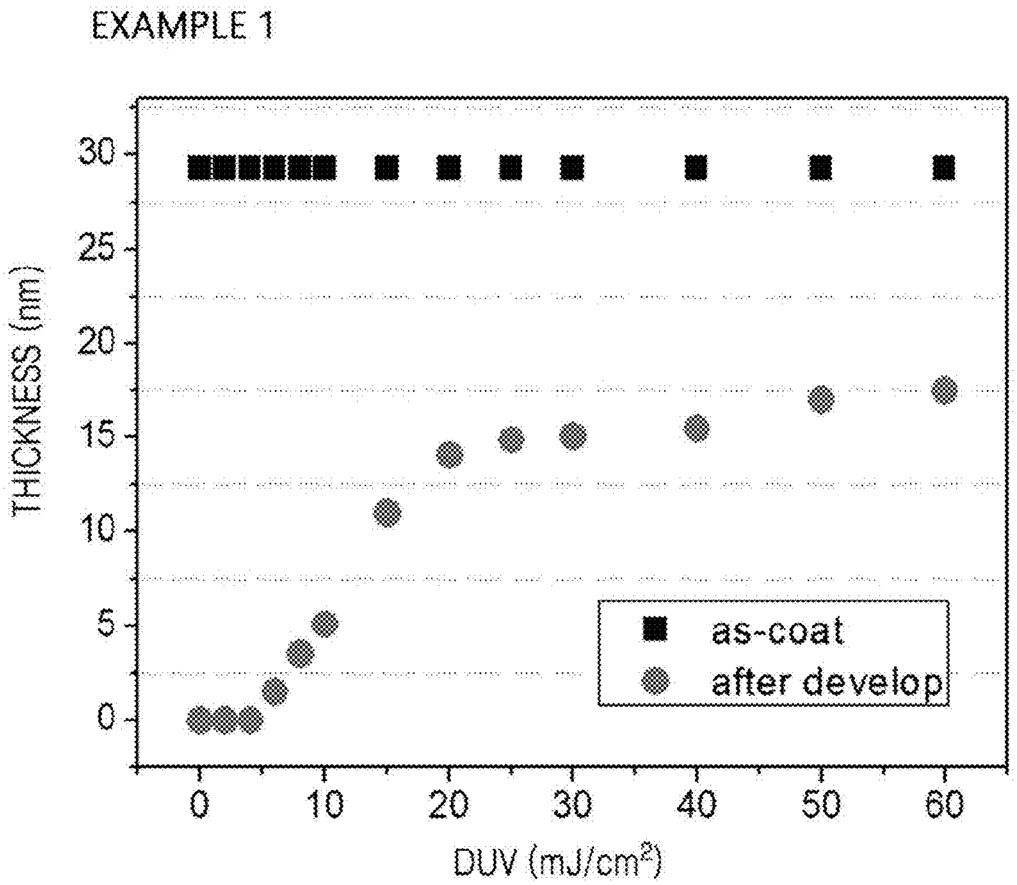
Figure 8D:
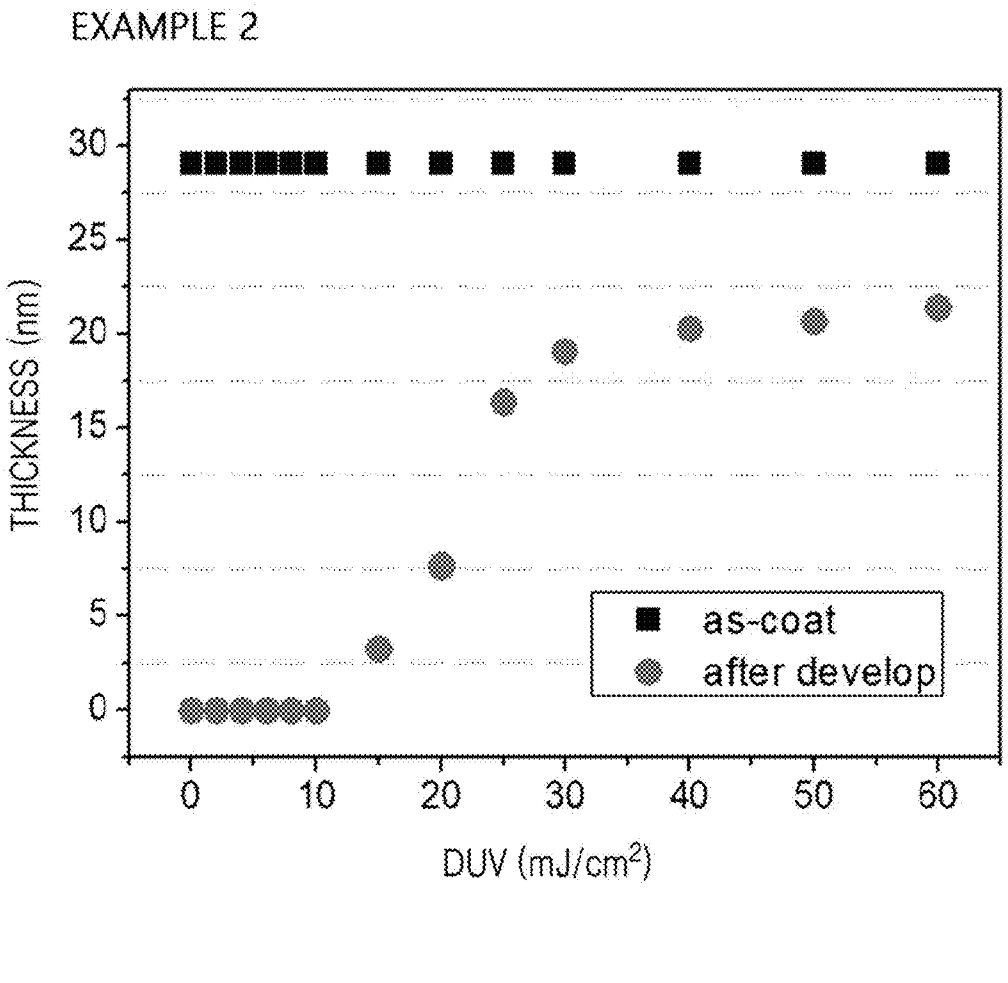
Figure 8E:
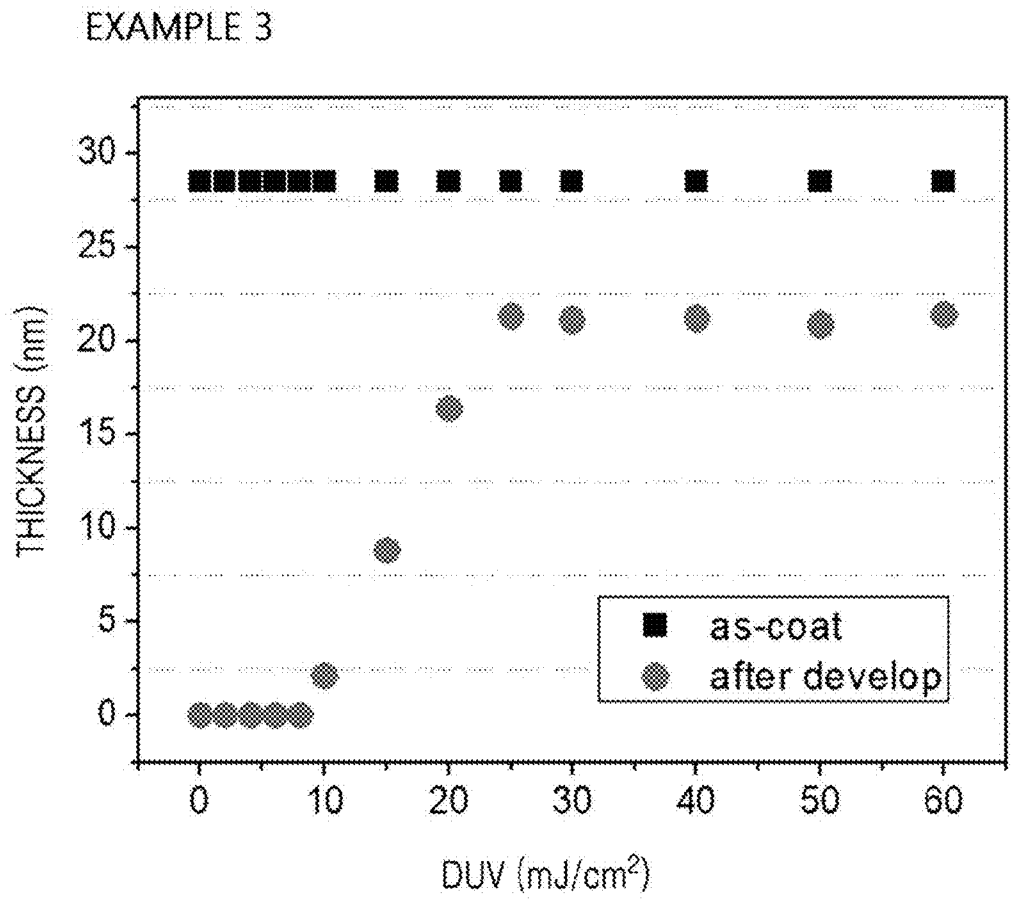
Figure 8F:
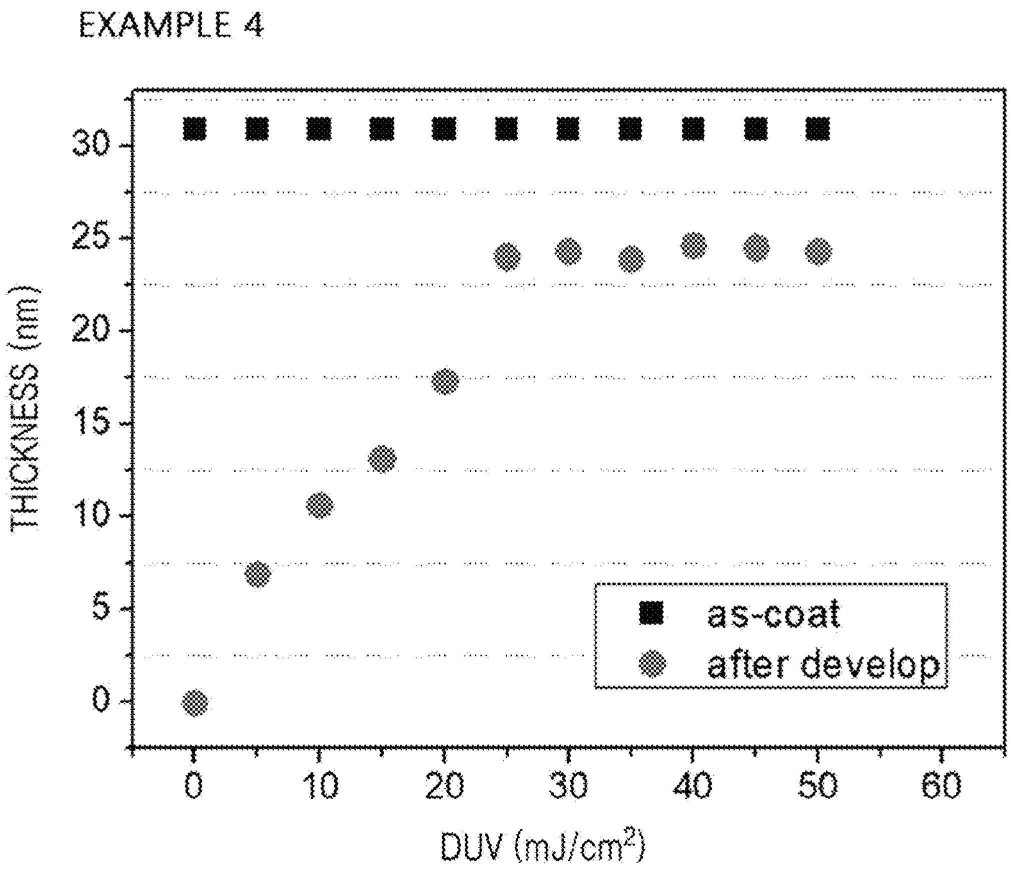

Di(4-fluorobenzyl) tin dichloride (0.5 g, 1.23 mmol) and 7 g of acetone were placed in a 50 ml reaction flask in an ice bath. To this, sodium acetate (0.2 g, 2.45 mmol) was added. The sample was stirred overnight, filtered, and the obtained solid was dried to obtain 0.45 g of compound T1 (yield: 65%). The obtained compound T1 was analyzed by $^{1}$H-NMR and $^{119}$Sn-NMR, and the results are shown in FIGS. 7C and 7D, respectively.

Evaluation Example: Evaluation of Thin Film Development

Specifically, 2 wt % of the polymers synthesized in Synthesis Examples 1 to 5 and Compound T1 synthesized in Synthesis Example 6 were dissolved in casting solvents listed in Table 1. In this regard, a weight ratio of the polymer and the organometallic compound is as shown in Table 1 below. A casting solution was spin-coated at 1,500 rpm on a silicon wafer coated with HMDS as a lower film of 3 nm, and then dried at 120° C. for 1 minute to prepare a film having an initial thickness shown in Table 1 below. Then, DUV rays with a wavelength of 254 nm was exposed at a dose of about 0 mJ/cm$^2$ to about 60 mJ/cm$^2$, and dried at about 150° C. to about 200° C. for 1 minute. After immersing the dried film in a PGMEA solution in which 2 wt % of acetic acid was dissolved, as a developing solution, at 25° C. for 60 seconds, thicknesses of the remaining film were measured and shown in Table 2 and FIGS. 8A to 8F.

TABLE 1

| | Organometallic compound | Polymer | Casting solvent | Weight ratio (T1: polymer) | PAB (°C) | Initial thickness (nm) | PEB (°C) |
|---|---|---|---|---|---|---|---|
| Comparative Example 1 | T1 | — | Ethyl lactate | — | 120 | 19.6 | 200 |

TABLE 1-continued

| | Organo-metallic com-pound | Polymer | Casting solvent | Weight ratio (T1: poly-mer) | PAB (°C) | Initial thick-ness (nm) | PEB (°C) |
|---|---|---|---|---|---|---|---|
| Com-para-tive Exam-ple 2 | T1 | SP205 | Ethyl lactate | 2:1 | 120 | 22.0 | 150 |
| Exam-ple 1 | T1 | P(VBS•Cl) | Ethyl lactate | 2:1 | 120 | 29.3 | 150 |
| Exam-ple 2 | T1 | P(VBS•Otf) | Ethyl lactate | 2:1 | 120 | 29.1 | 150 |
| Exam-ple 3 | T1 | P(VBS•C) | Ethyl lactate | 2:1 | 120 | 28.5 | 15 |
| Exam-ple 4 | T1 | P(VBC)-r-P(VBS•Cl) | Ethyl lactate | 2:1 | 120 | 30.9 | 15 |

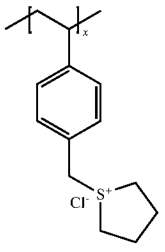

P(VBS•Cl)

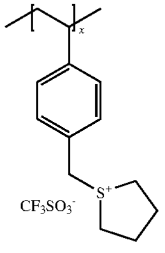

P(VBS•OTf)

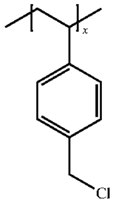

P(VBC)

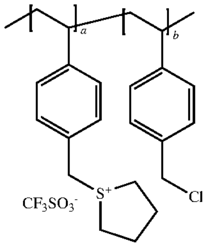

P(VBS•Cl/VBC) a:b = 16:84

TABLE 1-continued

| | Organo-metallic com-pound | Polymer | Casting solvent | Weight ratio (T1: poly-mer) | PAB (°C) | Initial thick-ness (nm) | PEB (°C) |
|---|---|---|---|---|---|---|---|

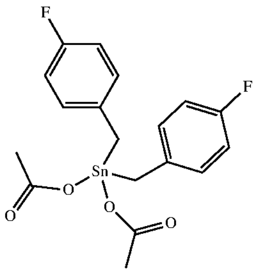

T1

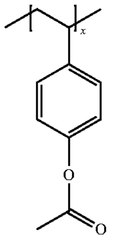

SP205

TABLE 2

| | Organome-tallic compound | Polymer | $E_{th}$ (mJ/cm$^2$) | $E_1$ (mJ/cm$^2$) | Remaining rate (%) | γ |
|---|---|---|---|---|---|---|
| Comparative Example 1 | T1 | — | 22 | 50 | 50 | 1.4 |
| Comparative Example 2 | T1 | SP205 | 42 | 70 | 39.1 | 1.8 |
| Example 1 | T1 | P(VBS.Cl) | 5 | 18 | 60 | 1.1 |
| Example 2 | T1 | P(VBS.Otf) | 12 | 25 | 72 | 2.3 |
| Example 3 | T1 | P(VBS.C) | 8 | 22 | 74 | 1.7 |
| Example 4 | T1 | P(VBC)-r-P(VBS.Cl) | 4 | 20 | 80 | 1.1 |

In Table 2, $E_{th}$ refers to an exposure dose at a point at which a thin film starts to harden, and $E_1$ refers to an exposure does at a saturation point at which a thickness of a thin film does not increase any longer. The remaining rate is a value obtained by dividing a thickness of a thin film at the saturation point by an initial thickness, and is expressed as a percentage, and y is a contrast curve, which consists of values calculated by Equation 1 below.

$$\gamma = \left|\log\left(\frac{E_{th}}{E_1}\right)\right|^{-1} \quad \text{Equation 1}$$

Referring to Table 2, it may be seen that Comparative Example 2 exhibits higher $E_{th}$ and $E_1$ values than Comparative Example 1, and since SP205 and T1 do not form a chemical bond with each other, it was confirmed that photosensitivity of the resist composition of Comparative Example 2 was not substantially improved.

On the other hand, it may be seen that each of Examples 1 to 4 exhibit smaller $E_{th}$ and $E_1$ values than Comparative Examples 1 and 2, and from this, it may be confirmed that the resist compositions of Examples 1 to 4 have higher sensitivity ($E_{th}$) than the resist compositions of Comparative Examples 1 and 2.

In addition, it may be seen that remaining rates of Examples 1 to 4 are improved compared to Comparative Example 1, suggesting that chemical bonds are formed between radicals formed from an organometallic compound and radicals formed from a polymer.

Some example embodiments of the inventive concepts may provide a resist composition that has improved sensitivity and provides a pattern with improved resolution.

It should be understood that some example embodiments described herein should be considered in a descriptive sense only and not for purposes of limitation. Descriptions of features or aspects within each example embodiment should typically be considered as available for other similar features or aspects in some example embodiments. While some example embodiments have been described with reference to the figures, it will be understood by those of ordinary skill in the art that various changes in form and details may be made therein without departing from the spirit and scope as defined by the following claims.

What is claimed is:

1. A resist composition, comprising:

an organometallic compound represented by Formula 1; and a polymer including a repeating unit represented by Formula 2:

Formula 1

$$M_{11}(R_{11})_n(OR_{12})_{(4-n)},$$

Formula 2

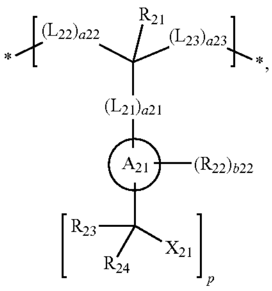

wherein, in Formulas 1 and 2, $M_{11}$ is indium (In), tin (Sn), antimony (Sb), tellurium (Te), thallium (Tl), lead (Pb), bismuth (Bi), silver (Ag), or polonium (Po), $R_{11}$ is a linear, branched, or cyclic $C_1$-$C_{30}$ monovalent hydrocarbon group optionally containing one or more heteroatoms, $R_{12}$ is a linear, branched, or cyclic $C_1$-$C_{30}$ monovalent hydrocarbon group optionally containing one or more heteroatoms, or is *-$M_{12}$ $(R_{13})_m(OR_{14})_{(3-m)}$, wherein $M_{12}$ is indium (In), tin (Sn), antimony (Sb), tellurium (Te), thallium (Tl), lead (Pb), bismuth (Bi), silver (Ag), or polonium (Po), $R_{13}$ and $R_{14}$ are each independently a linear, branched, or cyclic $C_1$-$C_{30}$ monovalent hydrocarbon group optionally containing one or more heteroatoms, and m is an integer of 0 to 3, n is an integer of 1 to 4, $L_{21}$ to $L_{23}$ are each independently a single bond, O, S, C(═O), C(═O) O, OC(═O), C(═O) NH, NHC(═O), or a linear, branched, or cyclic $C_1$-$C_{30}$ divalent hydrocarbon group optionally containing one or more heteroatoms, or any combination thereof, a21 to a23 are each independently an integer of 1 to 4, $A_{21}$ is a $C_6$-$C_{30}$ aryl group or a $C_1$-$C_{30}$ heteroaryl group, $R_{21}$ to $R_{24}$ are each independently hydrogen, deuterium, a halogen, or a linear, branched, or cyclic $C_1$-$C_{30}$ monovalent hydrocarbon group optionally containing one or more heteroatoms, b22 is an integer of 1 to 10, p is an integer of 1 to 10, $X_{21}$ is a leaving group, and

* is a binding site with a neighboring atom of a neighboring repeating unit of the polymer, wherein the resist composition is configured to form a chemical bond between a first radical formed from the organometallic compound represented by Formula 1 and a second radical formed from the polymer including the repeating unit represented by Formula 2, in response to exposure of the resist composition to at least one of heat or high-energy rays, the high-energy rays including at least one of, electromagnetic waves including at least one of ultraviolet rays, far-ultraviolet rays, extra-ultraviolet rays (EUV, wavelength 13.5 mm), X-rays, or y-rays, or a charged corpuscular beam.

2. The resist composition of claim 1, wherein, in Formula 1, a bond between $M_{11}$ and $R_{11}$ is an $M_{11}$-carbon single bond, and $R_{12}$ is *-$M_{12}(R_{13})_m(OR_{14})_{(3-m)}$, wherein $M_{12}$ is indium (In), tin (Sn), antimony (Sb), tellurium (Te), thallium (TD), lead (Pb), bismuth (Bi), silver (Ag), or polonium (Po), $R_{10}$ and $R_{14}$ are each independently a linear, branched, or cyclic $C_1$-$C_{30}$ monovalent hydrocarbon group optionally containing one or more heteroatoms, m is an integer of 0 to 3, and a bond between $M_{12}$ and $R_{13}$ is an $M_{12}$-carbon single bond.

3. The resist composition of claim 1, wherein the organometallic compound has a molecular weight of about 3,000 g/mol or less.

4. The resist composition of claim 1, wherein $M_{11}$ and $M_{12}$ are each independently Sn, Sb, Te, Bi, or Ag.

5. The resist composition of claim 1, wherein, in Formula 1, $R_{12}$ is *-$M_{12}(R_{13})_m(OR_{14})_{(3-m)}$, wherein $M_{12}$ is indium (In), tin (Sn), antimony (Sb), tellurium (Te), thallium (TR), lead (Pb), bismuth (Bi), silver (Ag), or polonium (Po), $R_{13}$ and Ru are each independently a linear, branched, or cyclic $C_1$-$C_{30}$ monovalent hydrocarbon group optionally containing one or more heteroatoms, and m is an integer of 0 to 3; and when $R_{11}$ and $R_{13}$ are each independently represented by *-$(L_{11})_{a11}$—$X_{11}$, and/or $R_{12}$ and $R_{14}$ are each independently represented by *-$(L_{12})_{a12}$—$X_{12}$, $L_{11}$ and $L_{12}$ are each independently $CR_aR_b$, C═O, S═O, $SO_2$, $PO_2$, or $PO_3$, a11 and a12 are each independently an integer of 0 to 3, $X_{11}$ and $X_{12}$ are each independently a substituted or unsubstituted $C_1$-$C_{30}$ alkyl group, a substituted or unsubstituted $C_1$-$C_{30}$ halogenated alkyl group, a substituted or unsubstituted $C_1$-$C_{30}$ alkoxy group, a substituted or unsubstituted $C_1$-$C_{30}$ alkylthio group, a substituted or unsubstituted $C_1$-$C_{30}$ halogenated alkoxy group, a substituted or unsubstituted $C_1$-$C_{30}$ halogenated alkylthio group, a substituted or unsubstituted $C_3$-$C_{30}$ cycloalkyl group, a substituted or unsubstituted $C_3$-$C_{30}$ cycloalkoxy group, a substituted or unsubstituted $C_3$-$C_{30}$ cycloalkylthio group, a substituted or unsubstituted $C_3$-$C_{30}$ heterocycloalkyl group, a substituted or an unsubstituted $C_3$-$C_{30}$ heterocycloalkoxy group, a substituted or unsubstituted $C_3$-$C_{30}$ heterocycloalkylthio group, a substituted or unsubstituted $C_2$-$C_{30}$ alkynyl group, a substituted or unsubstituted $C_2$-$C_{30}$ alkynyloxy group, a substituted or unsubstituted $C_2$-$C_{30}$ alkynylthio group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_1$-$C_{30}$ heteroaryl group, a substituted or unsubstituted $C_1$-$C_{30}$ heteroaryloxy group, or a substituted or unsubstituted $C_1$-$C_{30}$ heteroarylthio group, $R_a$ and $R_b$ are each independently hydrogen, deuterium, a hydroxyl group, a cyano group, a nitro group, a substituted or unsubstituted $C_1$-$C_{30}$ alkyl group, a substituted or unsubstituted $C_1$-$C_{30}$ alkoxy group, a substituted or unsubstituted $C_1$-$C_{30}$ alkylthio group, a substituted or unsubstituted $C_3$-$C_{30}$ cycloalkyl group, a substituted or unsubstituted $C_3$-$C_{30}$ cycloalkoxy group, or a substituted or unsubstituted $C_3$-$C_{30}$ cycloalkylthio group, and

* is a binding site with a neighboring atom.

6. The resist composition of claim 1, wherein the organometallic compound is represented by any one of Formulas 1-1 to 1-16:

1-1

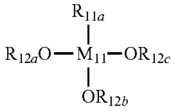

1-2

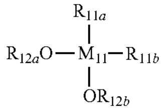

1-3

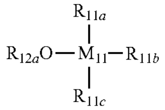

1-4

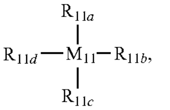

1-5

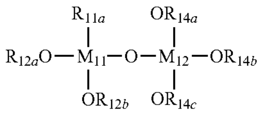

1-6

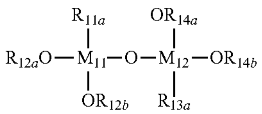

-continued 1-7

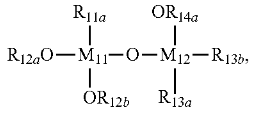

1-8

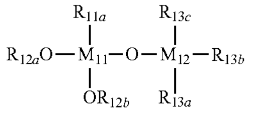

1-9

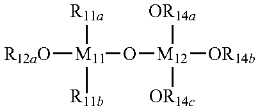

1-10

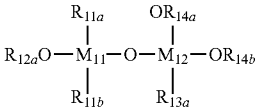

1-11

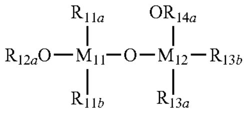

1-12

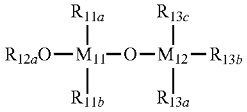

1-13

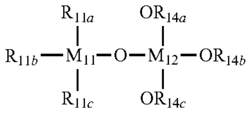

1-14

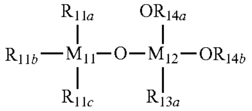

1-15

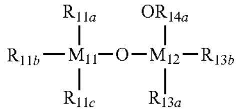

1-16

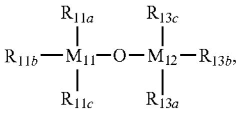

wherein, in Formulas 1-1 to 1-16, $M_{11}$ and $M_{12}$ are each independently indium (In), tin (Sn), antimony (Sb), tellurium (Te), thallium (Tl), lead (Pb), bismuth (Bi), silver (Ag), or polonium (Po), $R_{11a}$ to $R_{11d}$ are each independently a linear, branched, or cyclic $C_1$-$C_{30}$ monovalent hydrocarbon group optionally containing one or more heteroatoms, $R_{12a}$ to $R_{12c}$ are each independently a linear, branched, or cyclic $C_1$-$C_{30}$ monovalent hydrocarbon group optionally containing one or more heteroatoms or is *-$M_{12}(R_{13})_m(OR_{14})_{(3-m)}$, wherein $M_{12}$ is indium (In), tin (Sn), antimony (Sb), tellurium (Te), thallium (Tl), lead (Pb), bismuth (Bi), silver (Ag), or polonium (Po), $R_{13}$ and $R_{14}$ are each independently a linear, branched, or cyclic $C_1$-$C_{30}$ monovalent hydrocarbon group optionally containing one or more heteroatoms, m is an integer of 0 to 3, and * is a binding site with a neighboring atom, $R_{13a}$ to $R_{13c}$ are each independently a linear, branched, or cyclic $C_1$-$C_{30}$ monovalent hydrocarbon group optionally containing one or more heteroatoms, and $R_{14a}$ to $R_{14c}$ are each independently a linear, branched, or cyclic $C_1$-$C_{30}$ monovalent hydrocarbon group optionally containing one or more heteroatoms.

7. The resist composition of claim 1, wherein the polymer does not include any repeating unit that includes any acid labile group.

8. The resist composition of claim 1, in Formula 2, wherein $A_{21}$ is a benzene group, a naphthalene group, a phenanthrene group, an anthracene group, a chrysene group, a pyrene group, a triphenylene group, a fluorene group, a pyrrole group, a furan group, a thiophene group, an imidazole group, an oxazole group, a thiazole group, a pyridine group, a pyrazine group, a triazine group, a quinoline group, an isoquinoline group, a benzoquinoline group, a quinoxaline group, a quinazoline group, a cinoline group, a phenanthroline group, a phenanthridine group, an indole group, a benzofuran group, a benzothiophene group, a benzimidazole group, a benzoxazole group, a benzothiazole group, a carbazole group, a dibenzofuran group, or a dibenzothiophene group.

9. The resist composition of claim 1, wherein, in Formula 2, $X_{21}$ is an ammonium salt, a phosphonium salt, a sulfonium salt, a selenonium salt, an iodonium salt, a halogen, *-O—S(=O)$_2$—$R_{31}$, *-O—C(=O)—$R_{31}$, *-O—P(=O)($OR_{31}$)($OR_{32}$), or * —ONO, wherein * is a binding site with a carbon to which $R_{23}$ and $R_{24}$ are bonded in Formula 2, and $R_{31}$ and $R_{32}$ are each independently a linear, branched, or cyclic $C_1$-$C_{30}$ monovalent hydrocarbon group optionally containing one or more heteroatoms.

10. The resist composition of claim 1, wherein, in Formula 2, $X_{21}$ is a group represented by any one of Formulas 3-1 to 3-3, Cl, Br, I, *-O—S(=))$_2$—$R_{31}$, *-O—C(=O)—$R_{31}$, *-O—P(=O($OR_{31}$)($OR_{32}$), or *-ONO, wherein * is a binding site with a carbon to which $R_{23}$ and $R_{24}$ are bonded in Formula 2, $R_{31}$ and $R_{32}$ are each independently a linear, branched, or cyclic $C_1$-$C_{30}$ monovalent hydrocarbon group optionally containing one or more heteroatoms:

3-1

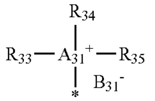

3-2

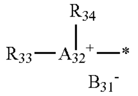

3-3

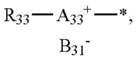

wherein, in Formulas 3-1 to 3-3, $A_{31}$ is N or P, $A_{32}$ is S or Se, $A_{33}$ is I, $B_{31}$ is a counter anion, $R_{33}$ to $R_{35}$ are each independently a linear, branched, or cyclic $C_1$-$C_{30}$ monovalent hydrocarbon group optionally containing one or more heteroatoms, wherein two adjacent groups of $R_{33}$ to $R_{35}$ are independently present or are bonded to each other to form a ring, and

* is a binding site with a neighboring atom.

11. The resist composition of claim 1, wherein the polymer is a copolymer comprising:

a first repeating unit represented by Formula 2-1; and a second repeating unit represented by Formula 2-2:

Formula 2-1

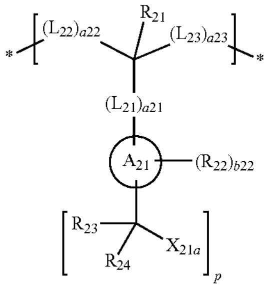

Formula 2-2

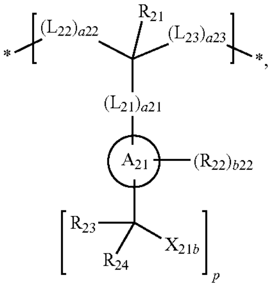

wherein, in Formulas 2-1 and 2-2, $L_{21}$ to $L_{23}$ are each independently a single bond, O, S, C(=O), C(=O) O, OC(=O), C(=O) NH, NHC (=O), or a linear, branched, or cyclic $C_1$-$C_{30}$ divalent hydrocarbon group optionally containing one or more heteroatoms, or any combination thereof, $A_{21}$ is a $C_6$-$C_{30}$ aryl group or a $C_1$-$C_{30}$ heteroaryl group, a21 to a23 are each independently an integer of 1 to 4, $R_{21}$ to $R_{24}$ are each independently hydrogen, deuterium, a halogen, or a linear, branched, or cyclic $C_1$-$C_{30}$ monovalent hydrocarbon group optionally containing one or more heteroatoms, b22 is an integer of 1 to 10, p is an integer of 1 to 10, $X_{21a}$ is an ammonium salt, a phosphonium salt, a sulfonium salt, a selenium salt, or an iodonium salt, $X_{21b}$ is a halogen, *-O—S(=O)$_2$—$R_{31}$, *-O—C(=O)—$R_{31}$, *-O—P(=O)($OR_{31}$)($OR_{32}$), or *-ONO, wherein * is a binding site with a carbon to which $R_{23}$ and $R_{24}$ are bonded in Formula 2-2, $R_{31}$ and $R_{32}$ are each independently a linear, branched, or cyclic $C_1$-$C_{30}$ monovalent hydrocarbon group optionally containing one or more heteroatoms, and

* is a binding site with a neighboring atom.

12. The resist composition of claim 1, wherein the polymer comprises a first repeating unit represented by Formula 2-1, and does not comprise any second repeating unit represented by Formula 2-2; or the polymer does not comprise any first repeating unit represented by Formula 2-1, and comprises a second repeating unit represented by Formula 2-2:

Formula 2-1

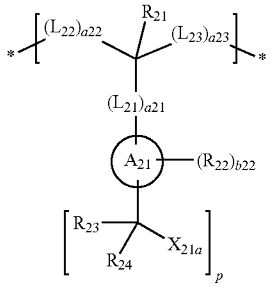

Formula 2-2

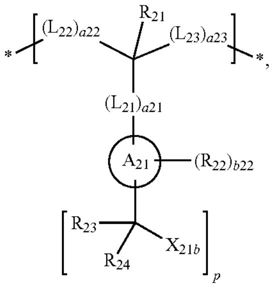

wherein, in Formulas 2-1 and 2-2, $L_{21}$ to $L_{23}$ are each independently a single bond, O, S, C(=O), C(=O) O, OC(=O), C(=O) NH, NHC(=O), or a linear, branched, or cyclic $C_1$-$C_{30}$ divalent hydrocarbon group optionally containing one or more heteroatoms, or any combination thereof, $A_{21}$ is a $C_6$-$C_{30}$ aryl group or a $C_1$-$C_{30}$ heteroaryl group, a21 to a23 are each independently an integer of 1 to 4, $R_{21}$ to $R_{24}$ are each independently hydrogen, deuterium, a halogen, or a linear, branched, or cyclic $C_1$-$C_{30}$ monovalent hydrocarbon group optionally containing one or more heteroatoms, b22 is an integer of 1 to 10, p is an integer of 1 to 10, $X_{21a}$ is an ammonium salt, a phosphonium salt, a sulfonium salt, a selenium salt, or an iodonium salt, $X_{21b}$ is a halogen, —O—S(=O)$_2$—$R_{31}$, *-O—C(=O)—$R_{31}$, *-O—P(=O)($OR_{31}$)($OR_{32}$), or *-ONO, wherein * is a binding site with a carbon to which Ros and Ras are bonded in Formula 2-2, $R_{31}$ and $R_{32}$ are each independently a linear, branched, or cyclic $C_1$-$C_{30}$ monovalent hydrocarbon group optionally containing one or more heteroatoms, and

* is a binding site with a neighboring atom.

13. The resist composition of claim 1, wherein the organometallic compound is included in an amount of about 10 parts by weight to about 1,000 parts by weight, with respect to 100 parts by weight of the polymer.

14. The resist composition of claim 1, wherein the polymer has a weight average molecular weight (Mw) of about 1,000 to about 500,000.

15. The resist composition of claim 1, further comprising an organic solvent, a surfactant, a crosslinker, a leveling agent, a colorant, or any combination thereof.

16. A resist composition comprising:

an organometallic compound represented by Formula 1; and a monomer represented by Formula 20:

Formula 1

$$M_{11}(R_{11})_n(OR_{12})_{(4-n)},$$

-continued

Formula 20

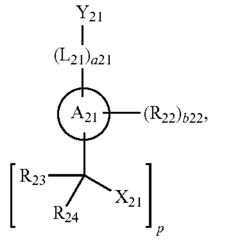

wherein, in Formulas 1 and 20, $M_{11}$ is indium (In), tin (Sn), antimony (Sb), tellurium (Te), thallium (Tl), lead (Pb), bismuth (Bi), silver (Ag), or polonium (Po), $R_{11}$ is a linear, branched, or cyclic $C_1$-$C_{30}$ monovalent hydrocarbon group optionally containing one or more heteroatoms, $R_{12}$ is a linear, branched, or cyclic $C_1$-$C_{30}$ monovalent hydrocarbon group optionally containing one or more heteroatoms, or is *-$M_{12}(R_{13})_m(OR_{14})_{(3-m)}$, wherein $M_{12}$ is indium (In), tin (Sn), antimony (Sb), tellurium (Te), thallium (Tl), lead (Pb), bismuth (Bi), silver (Ag), or polonium (Po), $R_{13}$ and $R_{14}$ are each independently a linear, branched, or cyclic $C_1$-$C_{30}$ monovalent hydrocarbon group optionally containing one or more heteroatoms, and m is an integer of 0 to 3, n is an integer of 1 to 4, $Y_{21}$ is a polymerizable group, $L_{21}$ is a single bond, O, S, C=O, C(=O) O, OC(=O), C(=O) NH, NHC(=O), or a linear, branched, or cyclic $C_1$-$C_{30}$ divalent hydrocarbon group optionally containing one or more heteroatoms, or any combination thereof, a21 is an integer of 1 to 4, $A_{21}$ is a $C_6$-$C_{30}$ aryl group or a $C_1$-$C_{30}$ heteroaryl group, $R_{21}$ to $R_{24}$ are each independently hydrogen, deuterium, a halogen, or a linear, branched, or cyclic $C_1$-$C_{30}$ monovalent hydrocarbon group optionally containing one or more heteroatoms, b22 is an integer of 1 to 10, p is an integer of 1 to 10, $X_{21}$ is a leaving group, and

* is a binding site with a neighboring atom, wherein the resist composition is configured to form a chemical bond between a first radical formed from the organometallic compound represented by Formula 1 and a second radical formed from the monomer represented by Formula 20, in response to exposure of the resist composition to at least one of heat or high-energy rays, the high-energy rays including at least one of, electromagnetic waves including at least one of ultraviolet rays, far-ultraviolet rays, extra-ultraviolet rays (EUV, wavelength 13.5 nm), X-rays, of y-rays, or a charged corpuscular beam.

17. The resist composition of claim 16, wherein $Y_{21}$ comprises a vinyl group, an acrylate group, a methacrylate group, an oxirane group, an epoxy group, an oxetane group, a thiol group, or any combination thereof, as a partial structure.

18. A method of forming a pattern, the method comprising:

forming a resist film based on applying the resist composition of claim 1;

exposing at least a portion of the resist film with high-energy rays to establish an exposed resist film; and developing the exposed resist film based on using a developing solution.

19. The method of claim 18, wherein the exposing is performed based on irradiating deep ultraviolet (DUV) rays, extreme ultraviolet (EUV) rays, and/or electron beams (EBs).

20. The method of claim 18, wherein chemical bonds are formed between the organometallic compound and the polymer based on exposing at least the portion of the resist film with the high-energy rays.

* * * * *